(12) United States Patent
James et al.

(10) Patent No.: US 6,201,442 B1
(45) Date of Patent: Mar. 13, 2001

(54) AMPLIFYING CIRCUIT

(76) Inventors: Anthony Michael James, 8/29 Robe Street, St. Kilda, Vic. 3182 (AU); William James Hildebrandt, 34 Leinster Street, Ormond, Vic. 3204 (AU)

(*) Notice: Subject to any disclaimer, the term of this patent is extended or adjusted under 35 U.S.C. 154(b) by 0 days.

(21) Appl. No.: 09/155,549
(22) PCT Filed: Mar. 27, 1996
(86) PCT No.: PCT/AU96/00172
 § 371 Date: Sep. 25, 1998
 § 102(e) Date: Sep. 25, 1998
(87) PCT Pub. No.: WO96/30998
 PCT Pub. Date: Oct. 3, 1996
(51) Int. Cl.$^7$ .................................................. H03F 1/36
(52) U.S. Cl. ................................................ 330/107; 330/98
(58) Field of Search .................................. 330/107, 109, 330/100, 99, 98, 69

(56) References Cited

U.S. PATENT DOCUMENTS

| 4,057,766 | * | 11/1977 | Lee | 330/107 |
|---|---|---|---|---|
| 4,205,276 | * | 5/1980 | Wright et al. | 330/107 |
| 4,275,357 | * | 6/1981 | Nakayama et al. | 330/107 |
| 4,415,868 | * | 11/1983 | Gross | 330/107 |
| 4,453,132 | * | 6/1984 | Stamler | 330/107 |
| 4,763,081 | * | 8/1988 | Jason | 330/107 |
| 5,317,277 | * | 5/1994 | Cavigelli | 330/109 |
| 5,371,479 | * | 12/1994 | Hagerty | 330/107 |
| 5,635,871 | * | 6/1997 | Cavigelli | 330/107 |
| 5,708,376 | * | 1/1998 | Ikeda | 330/107 |
| 5,751,184 | * | 5/1998 | Shou et al. | 330/107 |

FOREIGN PATENT DOCUMENTS

| 214042 | | 9/1981 | (DD) . |
|---|---|---|---|
| 2821549 | | 11/1978 | (DE) . |
| 56-164605 | * | 12/1981 | (JP) . |
| 60-136404 | * | 7/1985 | (JP) . |
| 63-126306 | * | 5/1988 | (JP) . |
| 2-206206 | * | 8/1990 | (JP) . |

OTHER PUBLICATIONS

Derwent Abst. Acc. No. 95–047156/07, C1.U24, JP,A, 6326523, (Pioneer Elec. Corp.) Nov. 25, 1994.*

* cited by examiner

*Primary Examiner*—Benny Lee
*Assistant Examiner*—Khanh Van Nguyen
(74) *Attorney, Agent, or Firm*—Larson & Taylor, PLC

(57) ABSTRACT

An amplifier is provided for audio or instrumentation applications which exhibits radically improved performance over existing amplifiers of comparable cost. In a preferred embodiment, the amplifier comprises two operational amplifiers ($A_1$, $A_2$) connected in cascade, where feedback elements ($Cf_2$, $Rf_2$) are connected across the second op amp ($A_2$) to cause an intermediate voltage signal (Z) to be substantially advanced in phase. In this embodiment, a capacitor ($Cf_1$) is also connected across the first op amp ($A_1$), and an outer DC loop is provided with damping circuitry ($Cf_3$) to reduce the closed loop gain at high frequencies, stabilizing the combination. The composite amplifier has performance far exceeding a conventional stand-along op amp and is very cheap to construct.

28 Claims, 21 Drawing Sheets

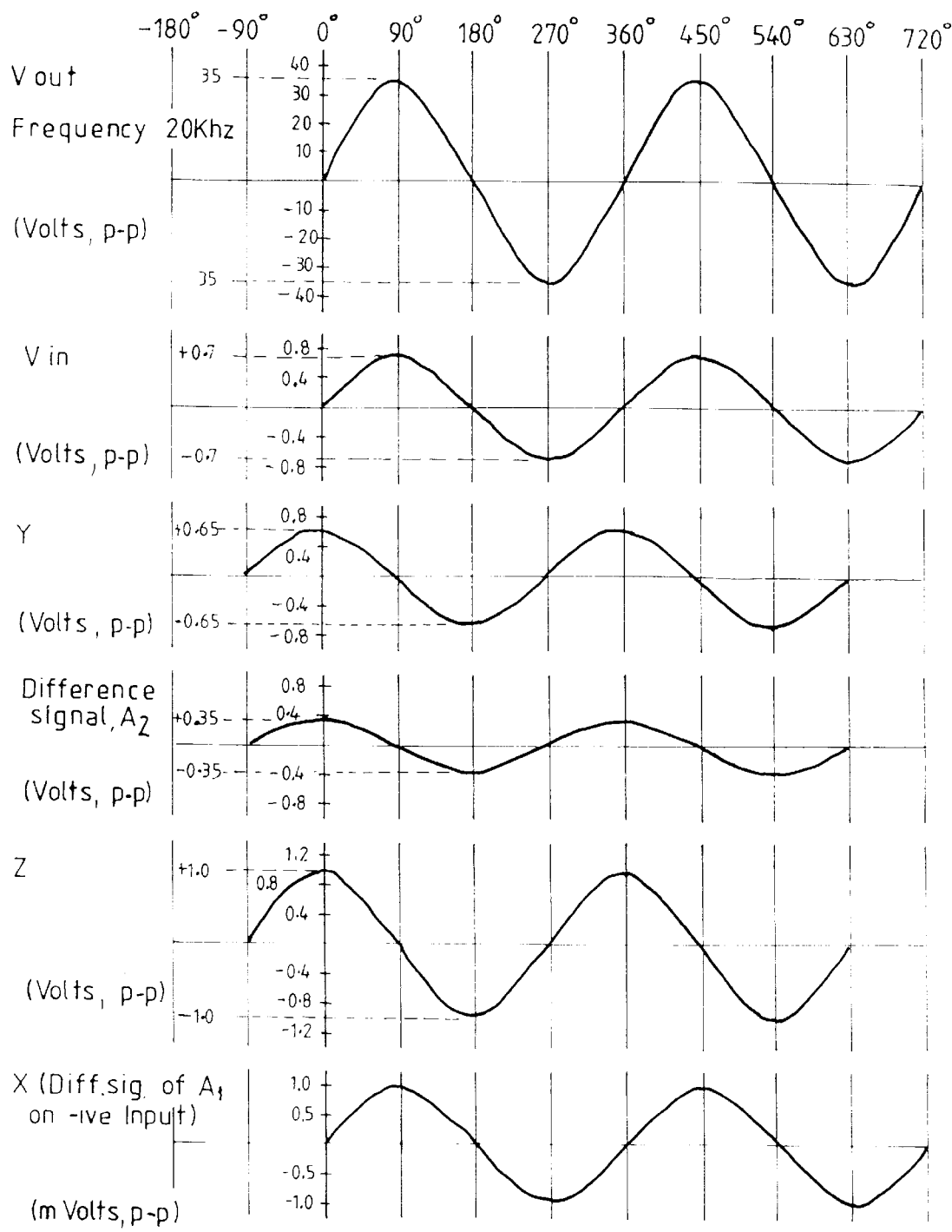
FIG_4_

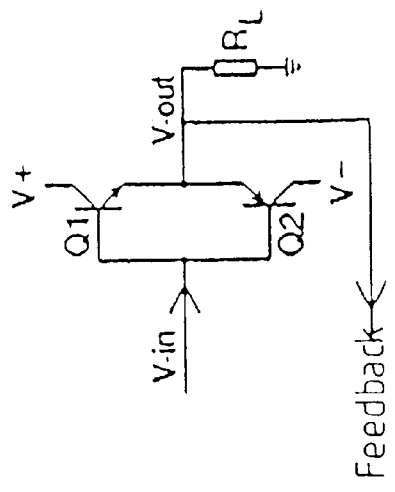
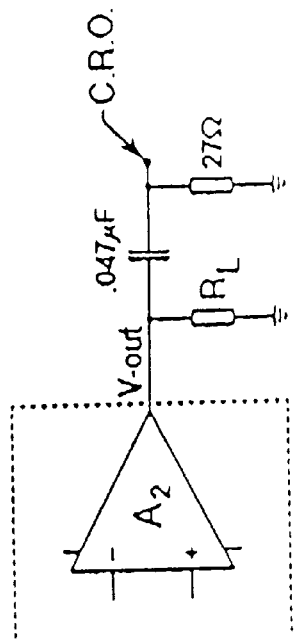
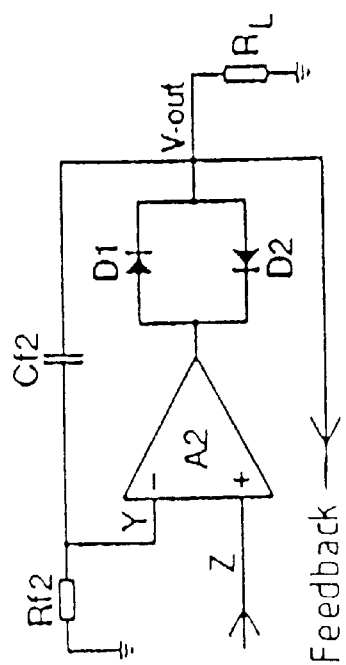
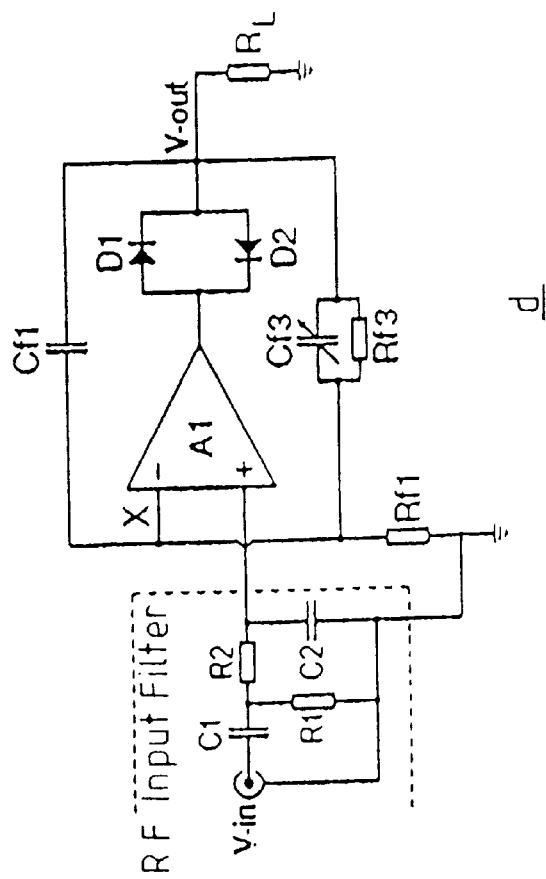
FIG. 8

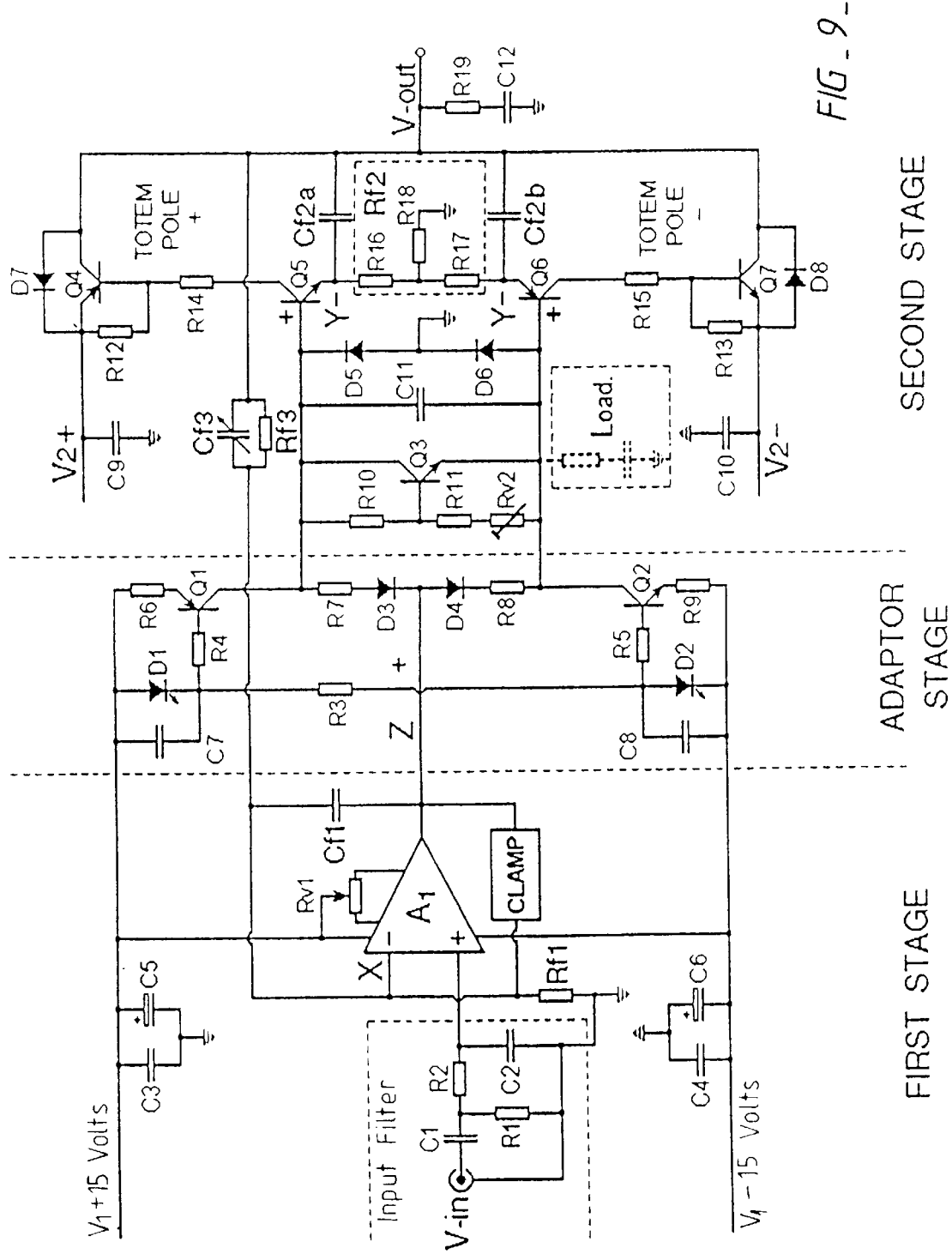
FIG_9

FIG_11.

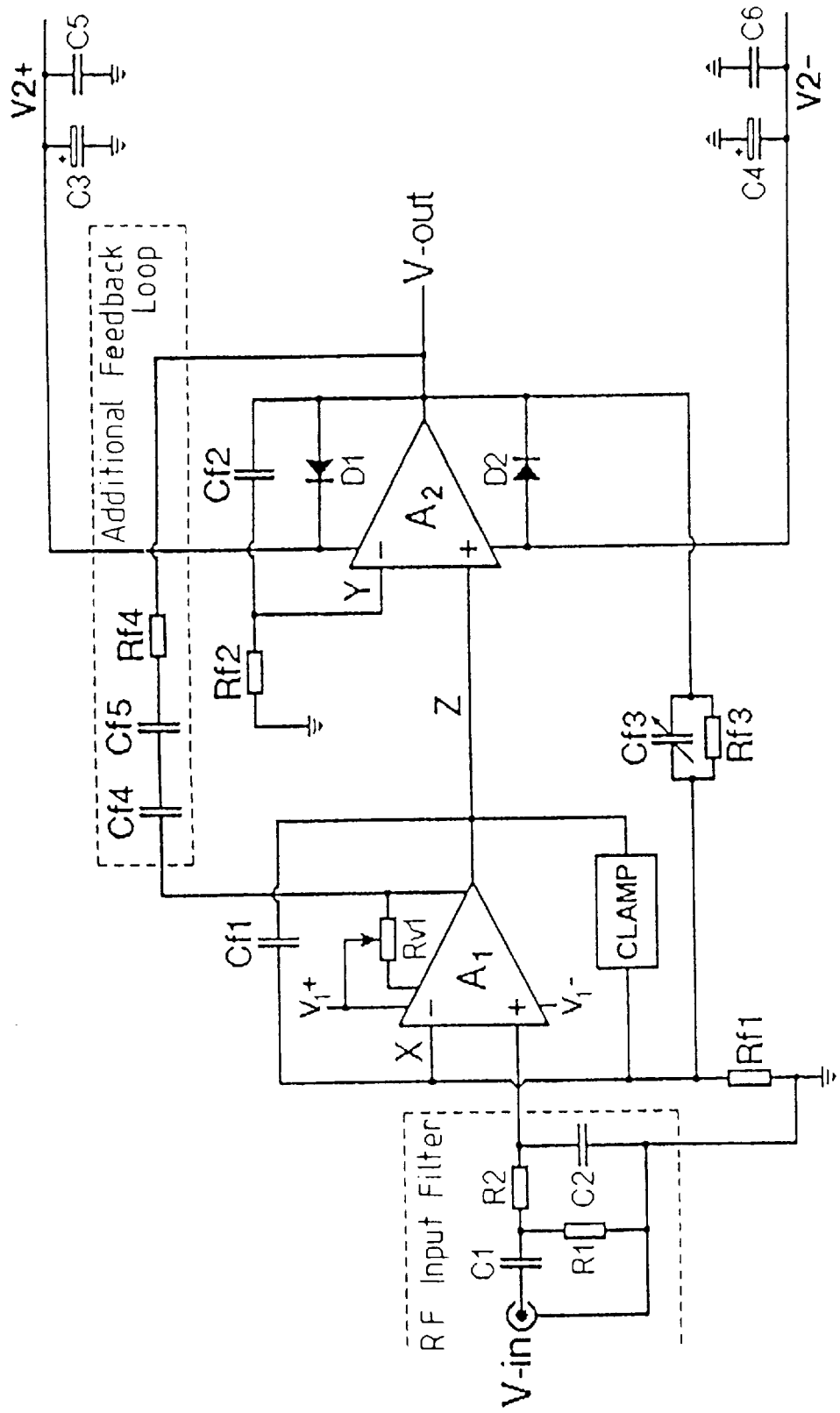
FIG_13

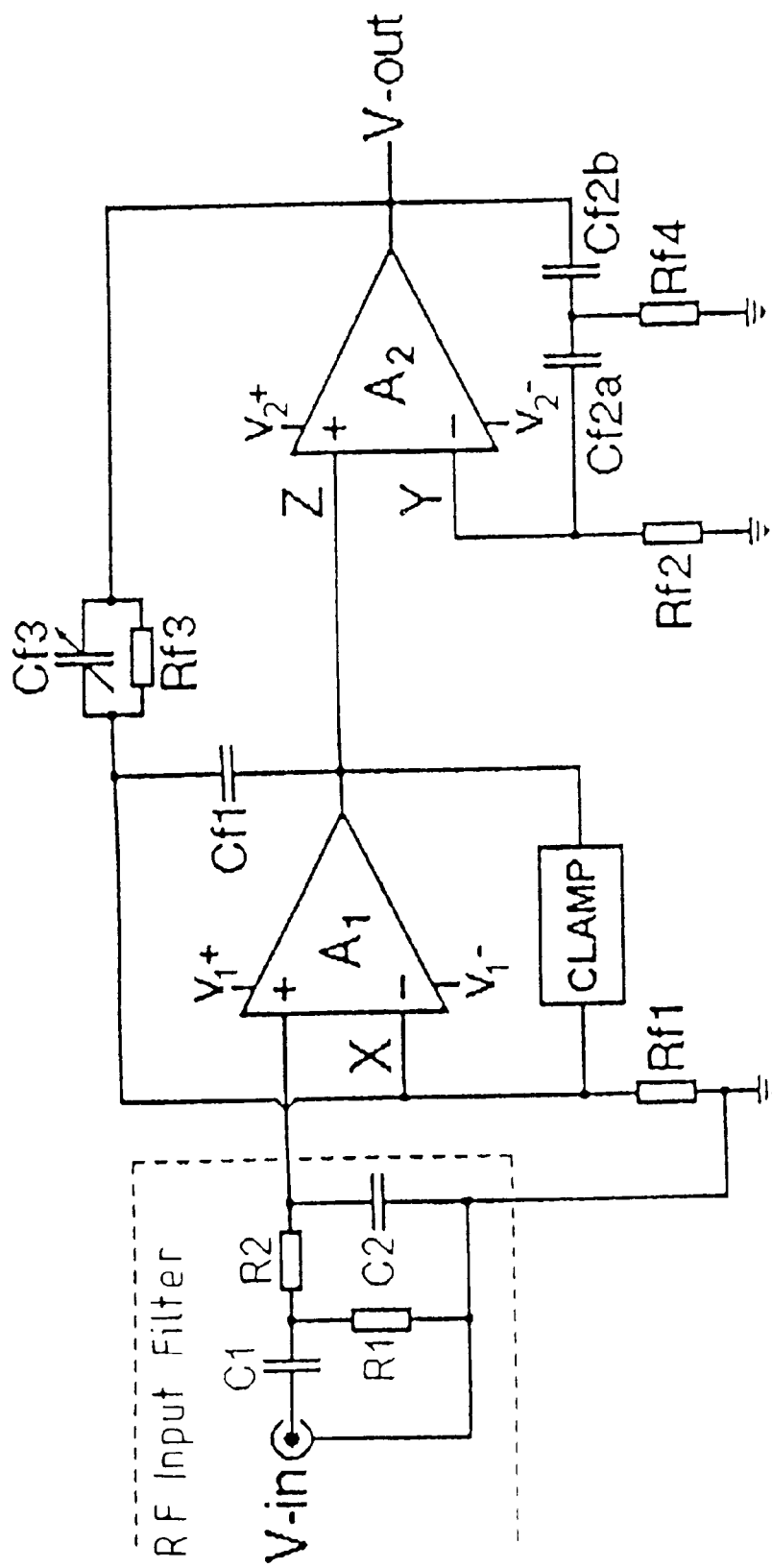
FIG_14a_

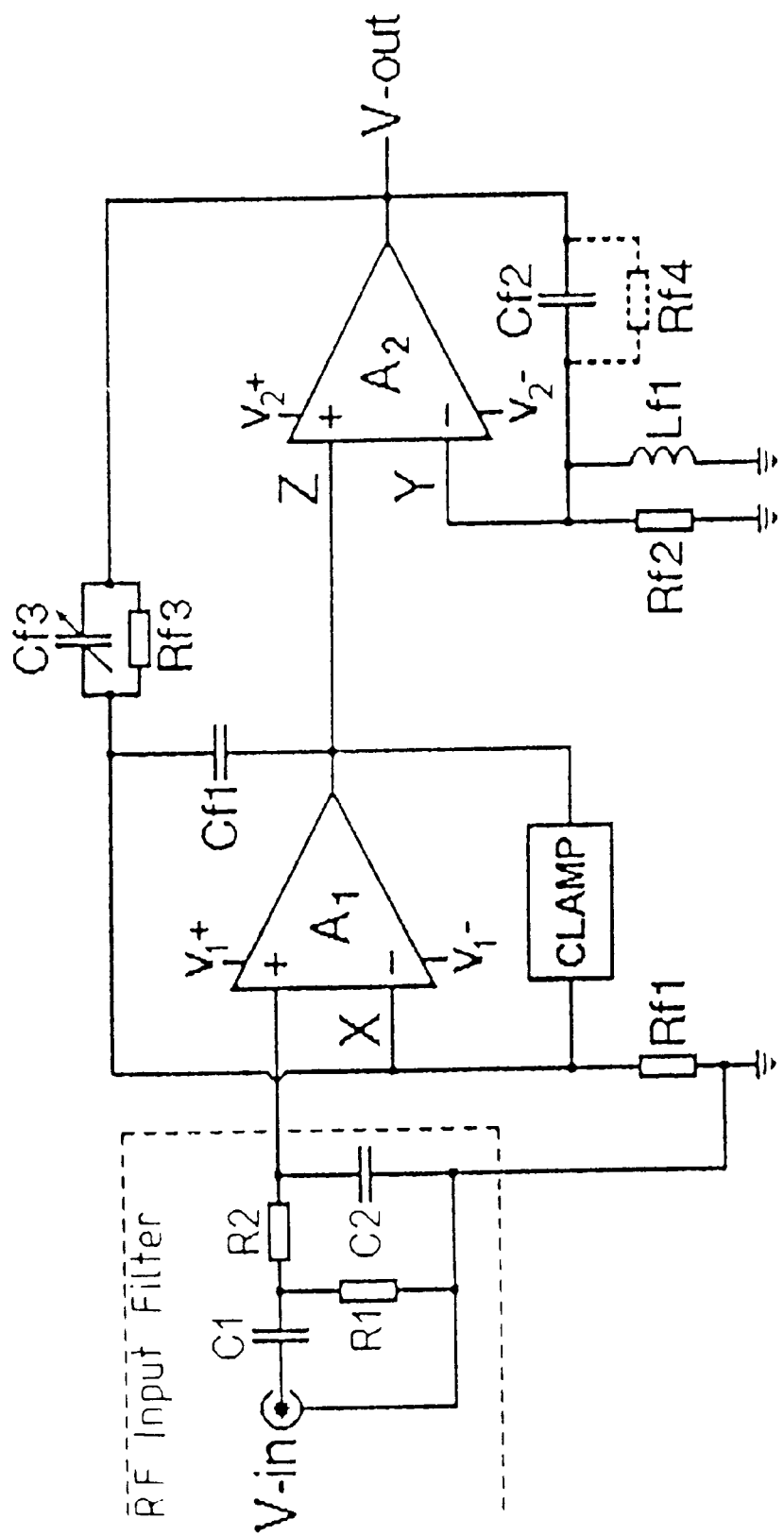
FIG_14b.

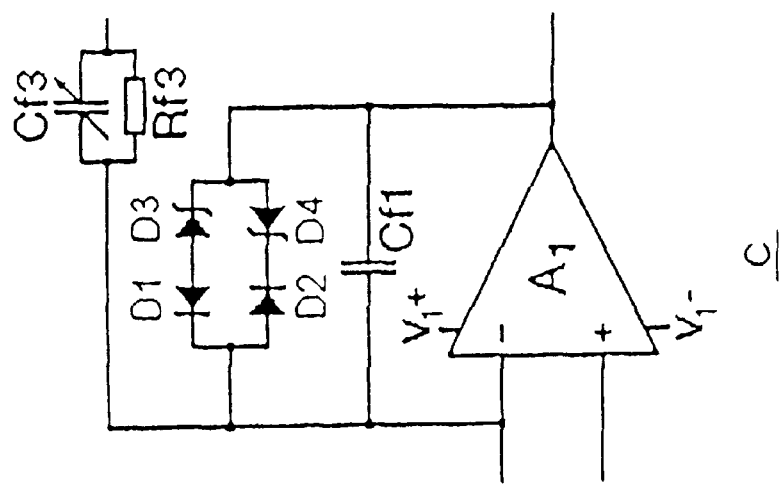
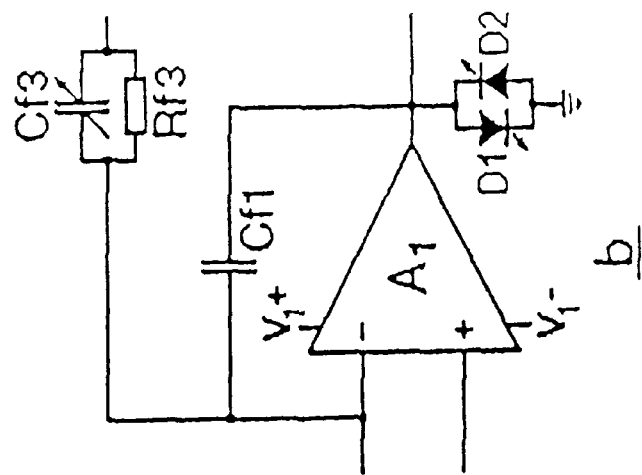
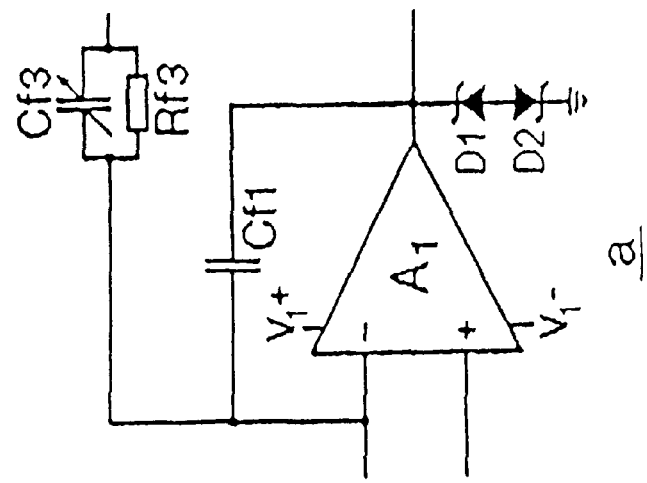
FIG_16_

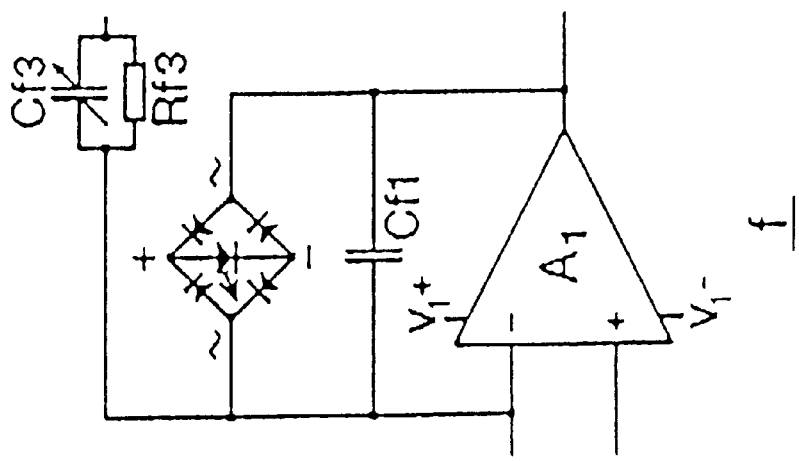
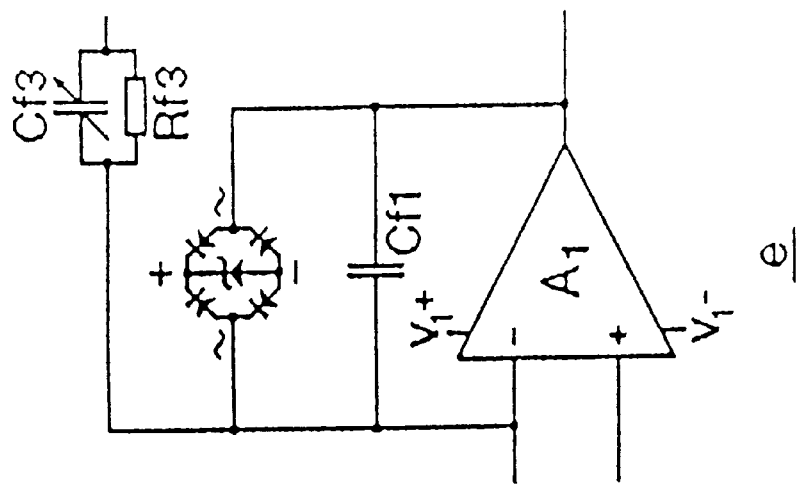
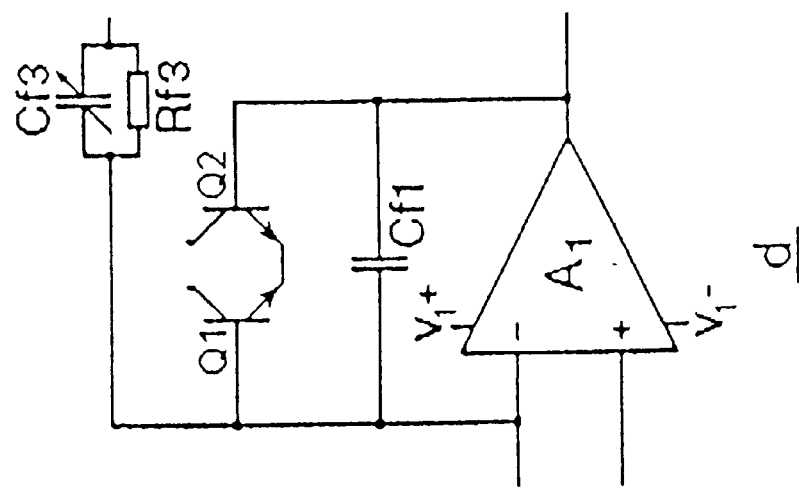
FIG_16_

AMPLIFYING CIRCUIT

FIELD OF THE INVENTION

This invention relates to amplifying circuits with substantially linear response, particularly but not limited to amplifiers suitable for high quality audio or instrumentation purposes.

BACKGROUND OF THE INVENTION

Amplifiers for use in audio applications and many instrumentation applications must have a closely linear frequency response from DC (0 Mz) to a high frequency, typically of the order of 20 kHz in the case of audio amplifiers, preferably well beyond.

One way of obtaining the required linearity is to design a set of cascaded amplifying stages, with the output of one amplifying stage feeding the input of an adjacent amplifying stage in the sequence, to obtain an amplifying circuit with a open loop gain much larger than required at DC, and, apply an outer negative feedback loop to the system which is frequency independent over the desired operating range, thereby producing an amplifier with a lower closed loop gain and an extended linearity in comparison to the open loop characteristics. Such an amplifier is shown schematically in FIG. 1 with two cascaded stages $\mu_1$ and $\mu_2$ inside a DC feedback loop with gain $1/\beta$. FIG. 2 illustrates this general principle, showing typical gain versus frequency on a log-log plot for a single pole compensated Op. Amp. Curve A shows a typical frequency response of the cascaded amplifier stages $\mu_1$ and $\mu_2$ shown in FIG. 1 with the negative feedback $\beta$. The frequency response is linear up to a frequency $f_o$ whereafter the frequency response D decreases at an increasing rate and for stability must usually be engineered to decrease at a uniform 20 db/decade (halving each octave) or not considerably more. Curve B shows the gain of the circuit in FIG. 1 with frequency-independent feedback loop $\beta$ installed, reducing the gain to a value much less than the open loop gain and thereby extending the linear frequency response to a value $f_c$ much larger than $f_o$.

An operational amplifier, hereafter referred to as an Op. Amp., is an electronic circuit or device which amplifies a signal which is the difference between the separate signals on its inverting and non-inverting input terminals (or +& − inputs). The output from the output terminals is typically symmetrical about a ground reference, and the device is powered by symmetrical positive and negative supply rails: exceptions are well known, along with the methods for making them behave in a similarly useful way to the typical case Op. Amps.

An Op. Amp is typically used as a linear amplifier for which feedback means are provided to its input terminals from its output terminal, in order to maintain a linear relation between the input signal and the amplified output signal. Without feedback, Op. Amps typically have a very high gain $\mu$ measuring from 10,000 to 100,000 or more.

Feedback means for linear operation is typically a resistive voltage divider from the output, with the inverting input connected to the junction of the voltage divider. The ratio characteristic of the voltage divider, by which it reduces the output voltage for feedback purposes, is known conventionally as $\beta$, and regarded as a fractional gain. When the + input is grounded, and a signal applied to the bottom of the voltage divider constituting the feedback means, the Op. Amp will invert the signal on the output, and have a closed a loop gain of $1/\beta$ for all practical purposes. The signal actually amplified is very small, approximately $-1/\mu$ times the output signal. The term $\mu\beta$ is known as the Loop Gain. The limiting case is where $\beta=1$, and Loop Gain equals $\mu$, otherwise of course Loop Gain is less than $\mu$. Conversely, when the bottom of the voltage divider is grounded, and a signal connected to the + input, the Op. Amp will non-invert, and have a closed loop gain of $1+1/\beta$.

Both the inverting and non-inverting configuration of an Op. Amp are used commonly, each having different advantages for various purposes. For practical purposes, linear amplification using Op. Amps must use one or the other, or more rarely both.

Both configurations are subject to the same limitations which place an upper limit on the $\mu$ of Op. Amps which can be usefully stabilised. This limitation imposes restrictions on the performance of Op. Amps. and restricts the usefulness of negative feedback in maintaining linearity and reducing distortion or errors on the output. Consequently a great deal of design effort is put into giving Op. Amps as high a $\mu$ as possible, consistent with stability or reliable operation under given feedback conditions and this depends also on expected loads the Op. Amp has to drive. With power amplifiers the problem is especially acute.

All operational amplifiers degrade in performance when required to deliver current into a load, and this applies especially to high quality audio power amplifiers, discrete or integrated. The better quality required the more difficult the design and production problems, and the greater the expense. It is generally agreed that high open loop gain is the only way to enhance the performance of an otherwise sound design.

The fundamental limitation on $\mu$ is associated with the work of Bode and Nyquist, whose conclusions are commonly summarised as follows: At low frequencies the input and output signals are precisely related in phase; 0° for non-inverting, and 180° for inverting configuration. At high frequencies however the output lags or retards in phase due to many unavoidable mechanisms in active devices like transistors, as well as parasitic capacitances. At the same time, and for similar reasons, the $\mu$ of an Op. Amp falls off with frequency, and at a progressively faster rate. At some frequency the output will be phase shifted by 180°, and if the Loop Gain ($1/\mu\beta$) is not less than one at this point, and amplifier will oscillate and be useless for other purposes. Most often, loads on the Op, Amp's output induce this condition, and then it is said to be unstable. Loop Gain=$1/\mu\beta$ (for inverters), so the more feedback applied to an Op. Amp, or the larger the fraction $\beta$ in the feedback network, the closer the amplifier is to instability. The worst case is when $\beta=1$, and the amplifier is at Unity Gain (voltage follower), Integrated Op. Amps are commonly made with internal frequency compensation so they are stable at Unity Gain. Still others are said to be decompensated, and have a minimum $1/\beta$ (AV) at which they are stable. Further types can be compensated externally as desired. In all cases there is a stability margin or safety factor, expressed in terms of the phase shift when $\mu\beta=1$. Different standards apply for different classes of use, but 135° is one accepted standard for common commercially available low level integrated Op. Amps (commonly known as "mini-DIP" in the 8 pin DIP form, but available in many other packages, e.g.: 14 pin DIP, 16 pin DIP, SIP, surface mount etc), giving a stability margin of 45°.

Frequency compensation comprises the various methods for making on Op. Amp's $\mu$ roll of with frequency at a (nearly) uniform rate, so that $\mu$ crosses the unit gain ($\mu$=1) point at a convenient frequency which will guarantee a suitable stability margin.

Since reducing an Op. Amp's μ degrades its performance, frequency compensation is always a question of arriving at an acceptable stability margin, leaving as high a μ as possible. A satisfactory minimum of frequency compensation is thus chosen.

Special care is required in power amplifiers, since instability can rapidly destroy output devices, and often the loads to which they are attached. The problem is especially acute in high quality audio amplifiers, whose performance practically depends on their μ, while their stability must be guaranteed under unpredictable load conditions.

Stability problems can be local or global and have many causes, all of which are exacerbated by higher open loop gain however it is produced, for example by adding more stages, or stages with inherently more voltage gain or by adding current buffers. In particular, it is generally thought impossible to construct a linear amplifier from two cascaded operational amplifiers inside the same linear DC feedback loop in which each operational amplifier operates at its open loop gain at DC. The resulting open loop gain of such a circuit is the product of the separate open loop gains at DC, and must roll off at higher frequencies at a rate of at least 40 dB per decade. Theoretical texts and practical experience typically suggest that such a combination cannot be stabilised and could not produce a useful linear amplifier with a useful power bandwidth.

It is well-known and demonstable experimentally that differentiated feedback is radially more effective than DC or restive feedback in correcting errors generated within the Op. Amp itself, otherwise known as distortion. In practice, differentiated feedback is commonly used in conjunction with DC feedback for frequency compensation, and also for reducing distortion. This is most usually done using capacitance, though inductors can sometimes be used.

It is known, although not commonly practised, to use nested differentiating feedback loops for stabilisation of multi-stage amplifiers. European Patent Application 92200283.7 (publication No 0499308A1) describes the use of nested capacitive feedback to stabilise amplifiers with 3 and more cascaded stages. Similar techniques have been previously described by Cherry (Australian Patent 521165) to result in an audio amplifier of low distortion and very high open loop gain. However such designs have been restricted in their practical applications, being rather complex to design and construct, and difficult to troubleshoot. No such techniques have previously been demonstrated to product a stable amplifier when the amplifier stages themselves have gain and impedance characteristics typical of complete stand along operational amplifiers. Such techniques have been restricted at best to stabilising amplifier stages, each being of relatively low gain and limited transconductance within an operational amplifier. Technical Handbooks supplied by Op. Amp manufactures (National Semiconductor Linear Applications Databook application notes AN272, AN 446, page 1063 for example) invariably describe cascaded op amp circuits with a substantial DC feedback component applied to the second Op. Amp, resulting in some improvement in distortion over a single Op. Amp, but limited in scope compared with what might be achieved if a composite open Loop Gain at DC approaching the product of the gains of the two Op. Amps could be reliably stabilised.

SUMMARY OF THE INVENTION

It is an object of the current invention to provide an amplifier with linear frequency response suitable for audio or instrumentation applications with a reduced cost and increased simplicity compared with prior art amplifiers of comparable performance.

It is a further object to provide a method of stabilising cascaded operational amplifiers within a DC loop offering extremely high open loop gain from DC, across the audio spectrum and preferably well beyond.

It is a still further object of the invention to provide a cost effective method of providing an operational amplifier of improved performance suitable for high quality audio or instrumentation applications.

Therefore in accordance with a first broad aspect of the invention there is provided an amplifying circuit with high open loop gain for amplifying an input voltage signal to produce an output voltage signal, including an upstream first amplifying stage connected in cascade with a downstream second amplifying stage within an outer loop, said outer loop providing substantially linear amplification over an operating frequency range suitable for audio or instrumentation applications, wherein a feedback means is connected to or associated with the second amplifying stage such that when a sinusoidal input voltage signal within an upper audible frequency range is provided, an intermediate voltage signal measured at an intermediate point of the forward path of the amplifying circuit between the first and second amplifying stages is substantially phase advanced with respect to a notional non-advanced phase, the intermediate voltage signal remaining substantially phase advanced with current load.

The "notional non-advanced phase" is defined throughout this specification to mean (i) the phase of the output voltage signal, if the intermediate voltage signal is fed into a non-inverting input of the second amplifying stage;

(ii) 180 degrees out of phase with output voltage signal, if the intermediate voltage signal is fed into an inverting input of the second amplifying stage.

By concentrating on ensuring that the substantial phase advance is provided at the intermediate stage and remains substantial under current load, it has been found that an island of ultrastability exists whereby a very low distortion amplifying circuit can be constructed out of cheap components.

Preferably, the high open loop gain of the amplifying circuit at DC is greater than the open loop gain typical of operational amplifiers.

Preferably, the second amplifying stage and more preferably also the first amplifying stage has an open loop gain typical of operational amplifiers.

Preferably, the second amplifying stage and more preferably also the first amplifying stage has a transconductance typical of operational amplifiers, whereby the phase advance of the intermediate signal may remain unchanged under current load.

Preferably, the second amplifying stage and more preferably also the first amplifying stage is a complete stand alone operational amplifier.

Preferably, the feedback means connected to the second operational amplifier is such that the phase advance of the intermediate signal is approximately 90 degrees, more preferably frequency independent over said frequency range. If the phase advance is 90 degrees at low frequencies, the amplifying circuit may be constructed such that the DC open loop gain of the amplifying circuit is substantially the product of the open loop gains of each amplifying stage, and this relationship is substantially maintained across the power bandwidth.

Preferably also, the feedback means is arranged to form with the second amplifying stage an integrator such that when a general input voltage signal is provided, the intermediate voltage signal is proportional to the differential of a voltage signal emerging from the second amplifying stage. In a non-inverting configuration of the second amplifying stage, the feedback means may comprise a capacitor connected between the output of the second amplifying stage and an inverting input of the second amplifying stage, together with a resistor connected between an inverting input of the second amplifying stage and ground. In this configuration, the intermediate signal is fed into the non-inverting input of the second operational amplifier. In an inverting configuration of the second amplifying stage, the feedback means may comprise a capacitor connected between the output of the second amplifying stage and the inverting input of the second amplifying stage together with a resistor connected between said inverting input of the second amplifying stage and the intermediate point. In this configuration, the intermediate signal is fed into the inverting input of the second amplifying stage and the non-inverting input of the second amplifying stage is connected to ground.

Preferably also, further feedback means is connected to the first amplifying stage. The further feedback means may comprise a capacitor connected between an output of the first amplifying stage and the inverting input of the first amplifying stage. In a non-inverting configuration of the first amplifying stage, the input signal is connected to a non-inverting input of the first amplifying stage. In an inverting configuration, the input signal is connected to the inverting input of the first amplifying stage.

Preferably also, the outer loop comprises an outer loop damping means to reduce the closed loop gain of the amplifying circuit at high frequencies, thereby providing or enhancing stability of the amplifier circuit. The outer loop damping means may comprise a capacitor in parallel with a resistor within said outer loop.

In embodiments suitable for audio amplifiers, the second amplifying stage may be a power amplifying stage for providing large output currents and/or large output voltage swings.

Preferably also the intermediate point has its discursion clamped to eliminate a possible non-linear and sometimes transient instability, and also to improve recovery from voltage overload.

Preferably also input filtering means are provided to filter the input signal of unwanted high frequencies such as RF pick-up.

In accordance with a second broad aspect of the invention there is provided a method of stabilising an amplifying circuit for amplifying an input signal to produce an output signal, wherein a circuit as defined in the first broad aspect of the invention is constructed.

In accordance with a third broad aspect of the invention there is provided a composite operational amplifier having improved stability and distortion, comprising an upstream first operational amplifier connected in cascade with a downstream second operational amplifier, wherein feedback means are connected to the second operational amplifier such that the second operational amplifier acts as an integrator, and further feedback means is connected to the first operational amplifier comprising a capacitor connected between the output and in input of the first operational amplifier, and such that in use the composite operational amplifier may be placed within an outer loop of specified DC gain, stabilising damping means being provided on the outer loop to provide stable linear amplification.

In accordance with a fourth broad aspect of the invention there is provided an amplifier comprising:
an upstream first operational amplifier connected in cascade with a downstream second operational amplifier;
feedback means connected to or associated with the second operational amplifier;
further feedback means connected to or associated with the first operational amplifier;
an outer loop with resistive feedback to define a substantially linear amplification suitable for audio or instrumentation applications;
outer loop damping means connected to or associated with the outer loop to reduce the gain of the amplifier at high frequencies;
said feedback means and further feedback means being selected so as to provide an amplifier with open loop gain substantially greater than the open loop gain of either operational amplifier and said outer loop damping means being adjusted so as to stabilise the amplifier.

Further aspects and preferred features of the invention will become apparent from the following description and the claims.

DESCRIPTION OF PREFERRED EMBODIMENTS

In order that the invention may be more clearly ascertained, preferred embodiments will now be described with reference to the accompanying FIGS. 3 to 17, where:

FIG. 4 is a plot showing voltage wave forms to be found at specified points of a circuit constructed according to the first embodiment;

FIGS. 8a, 8b, 8c, and 8e illustrate methods of checking error correction.

FIG. 9 shows another embodiment of the invention where the second amplifying stage is made from discrete components.

Figure 10:
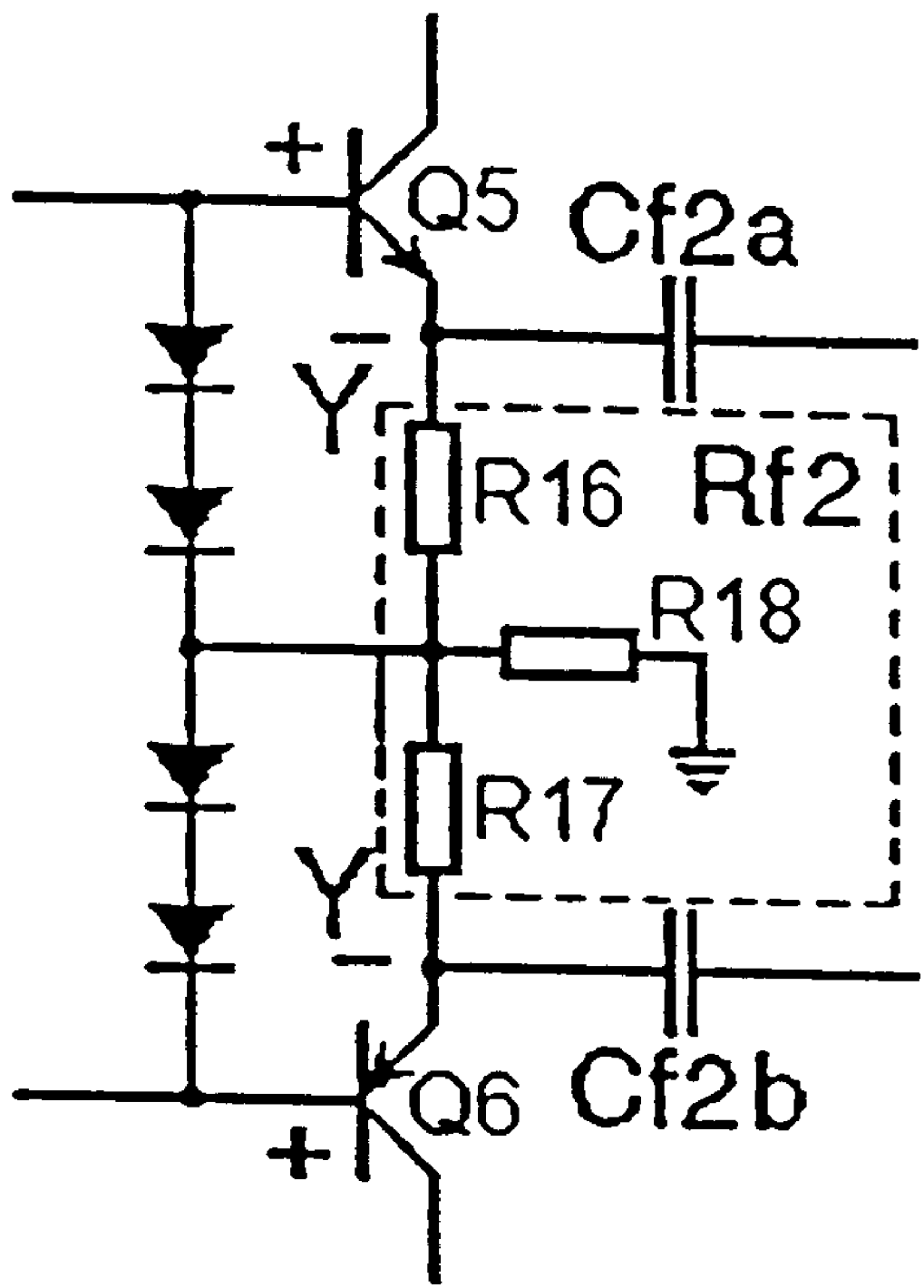

FIG. 10 shows a variation on a part of the circuit shown in FIG. 9.

Figure 11:
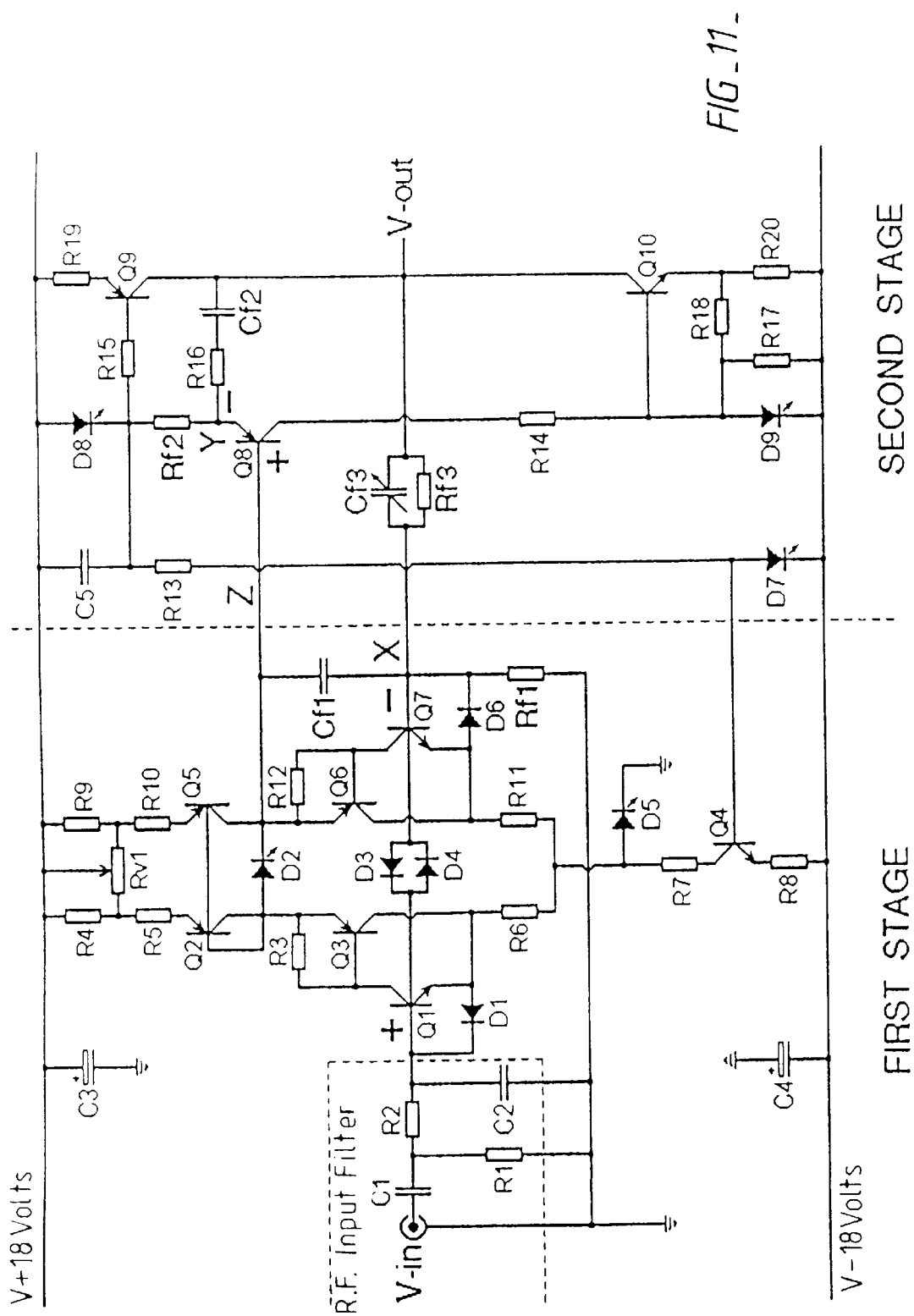

FIG. 11 shows another embodiment of the invention where both amplifying stages are made from discrete components.

Figure 12:
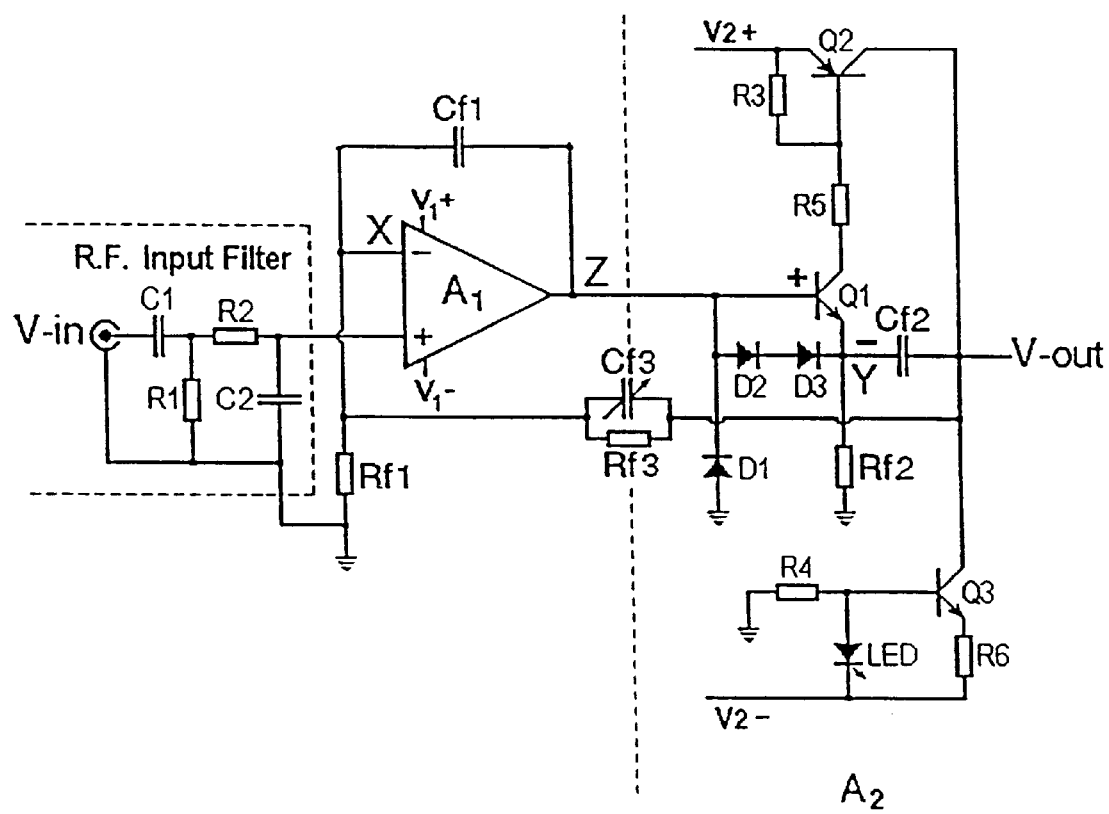

FIG. 12 shows a version with a high gain discrete second stage.

FIG. 13 shows a version with an additional feedback loop.

Figure 14C:
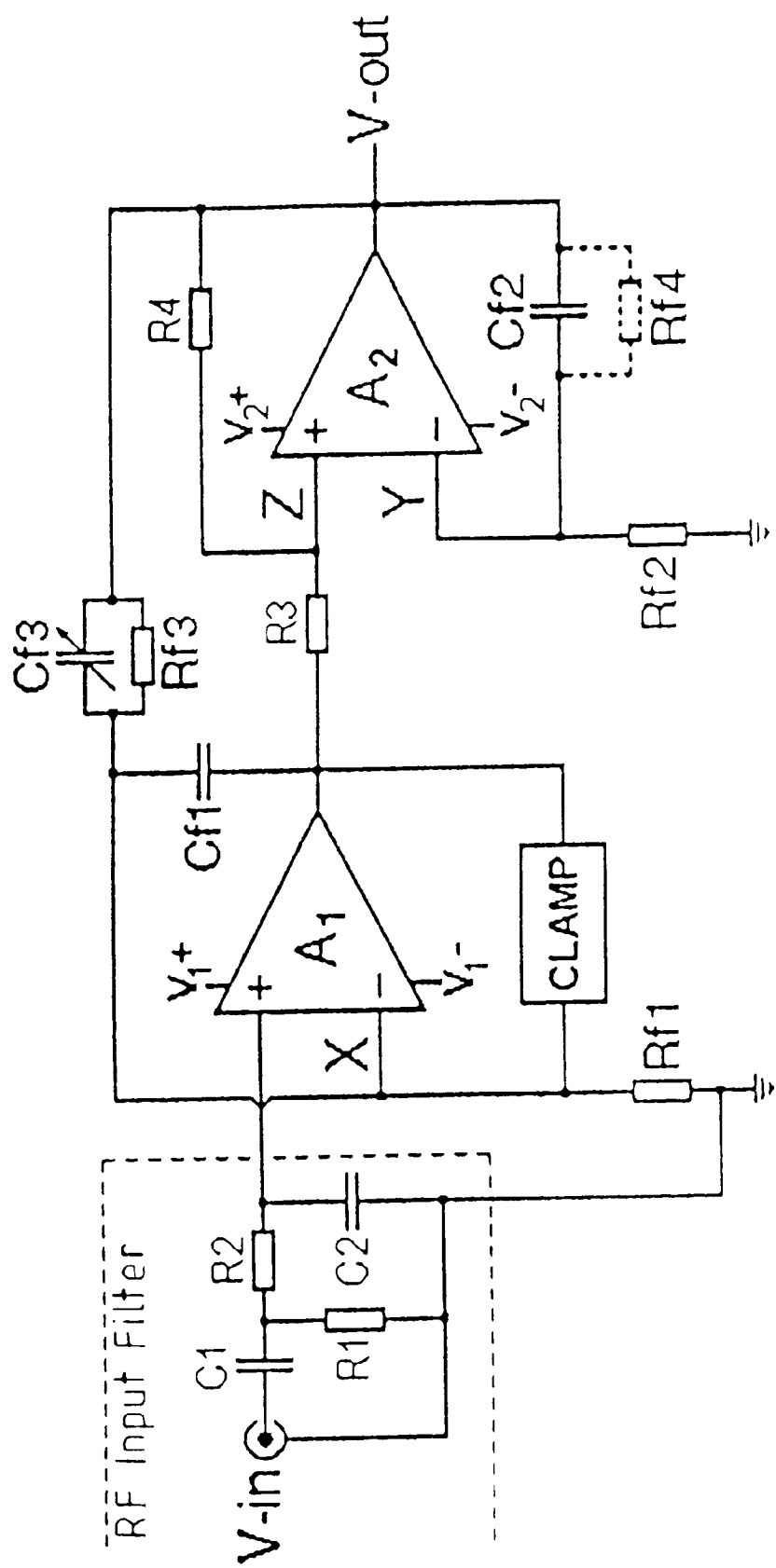

FIGS. 14a, 14b and 14c show alternative ways of advancing the phase of the intermediate signal beyond −90°.

Figure 15:
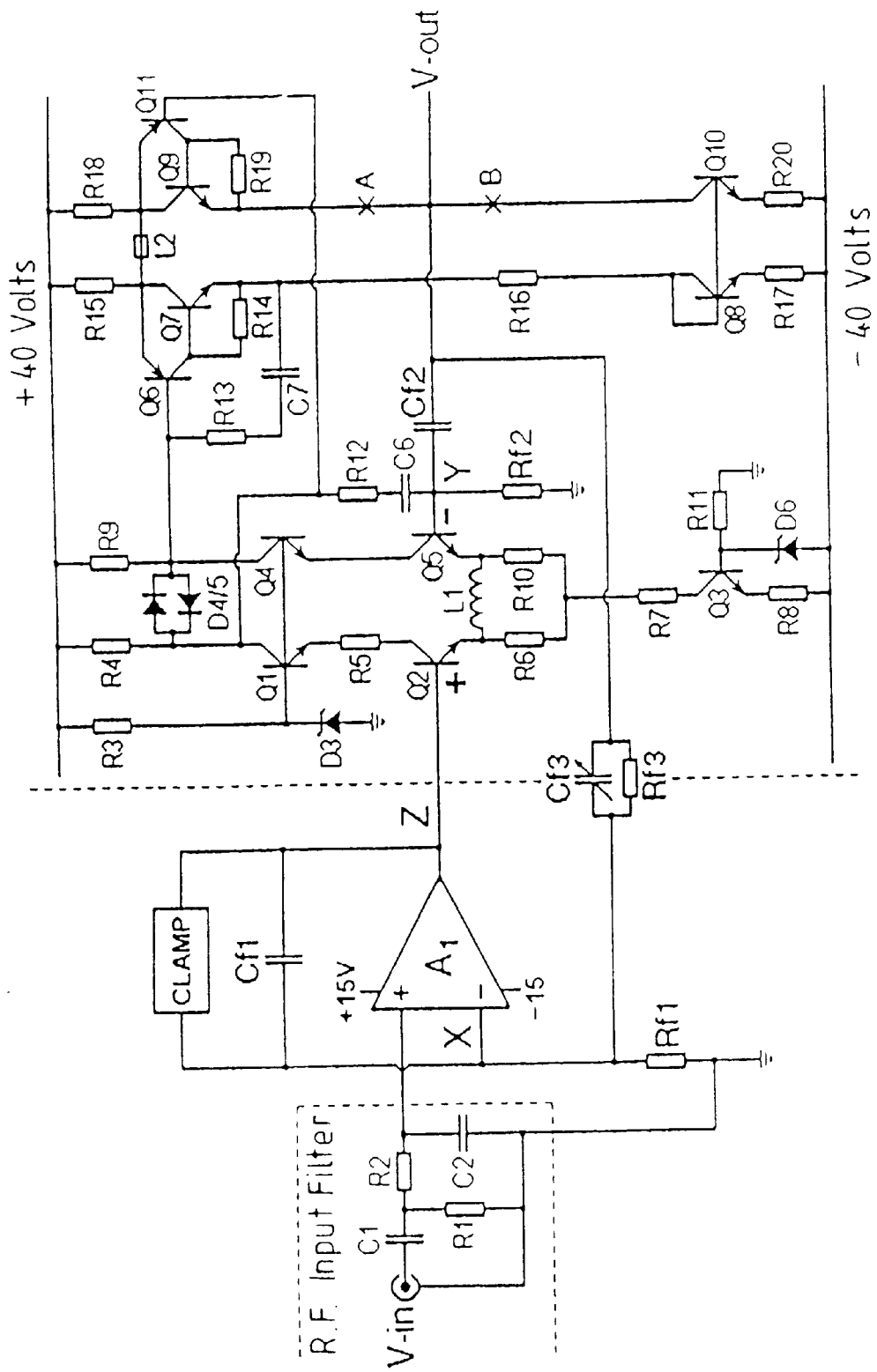

FIG. 15 shows a discrete Op. Amp as A2 suitable for high voltage rails, capable of driving a current boosting stage for very high power.

FIGS. 16a to 16f show alternative methods for clamping the discursion of the intermediate signal by clamping the output of the first Op. Amp in the various embodiments discussed.

Figure 17:
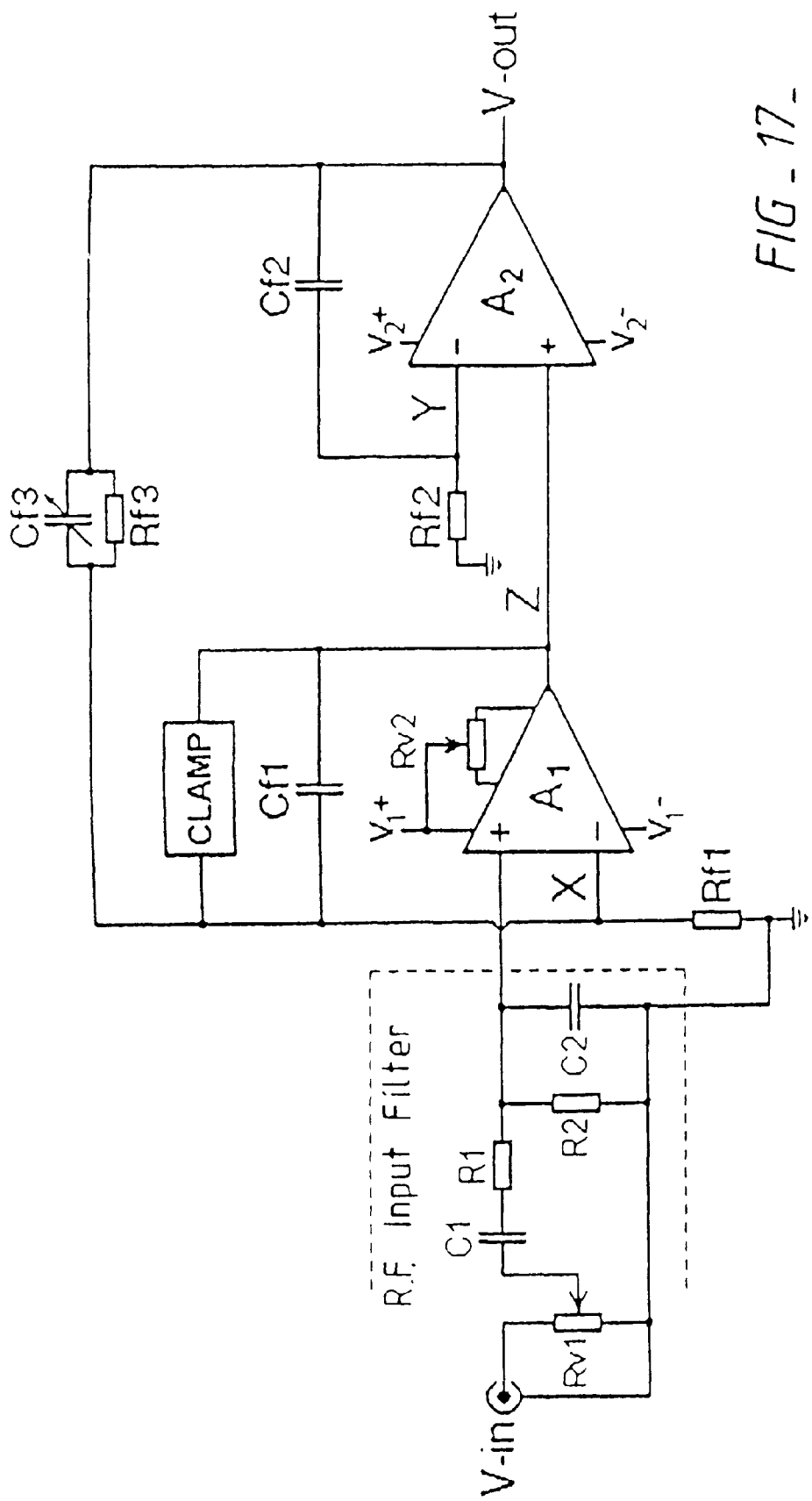

FIG. 17 shows a preamplifier embodying the invention and having a volume control.

Figure 1:
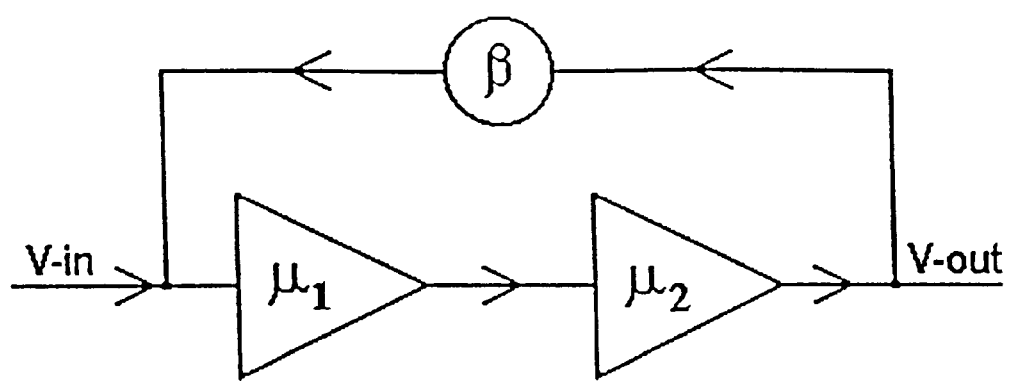
FIG. 1 is a circuit diagram of a prior art amplifying circuit having two cascaded stages inside a DC feedback loop.
Figure 2:
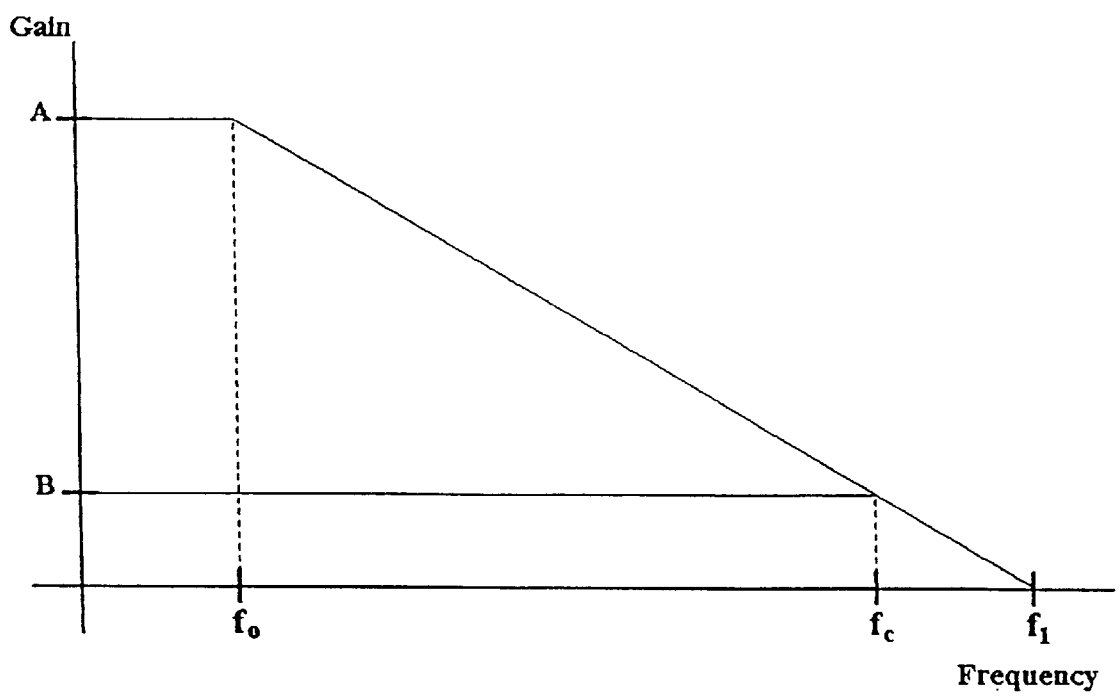
FIG. 2 is a lock-log plot of gain versus frequency for the prior art circuit of FIG. 1, with and without a frequency-independent feedback loop installed.
Figure 3A:
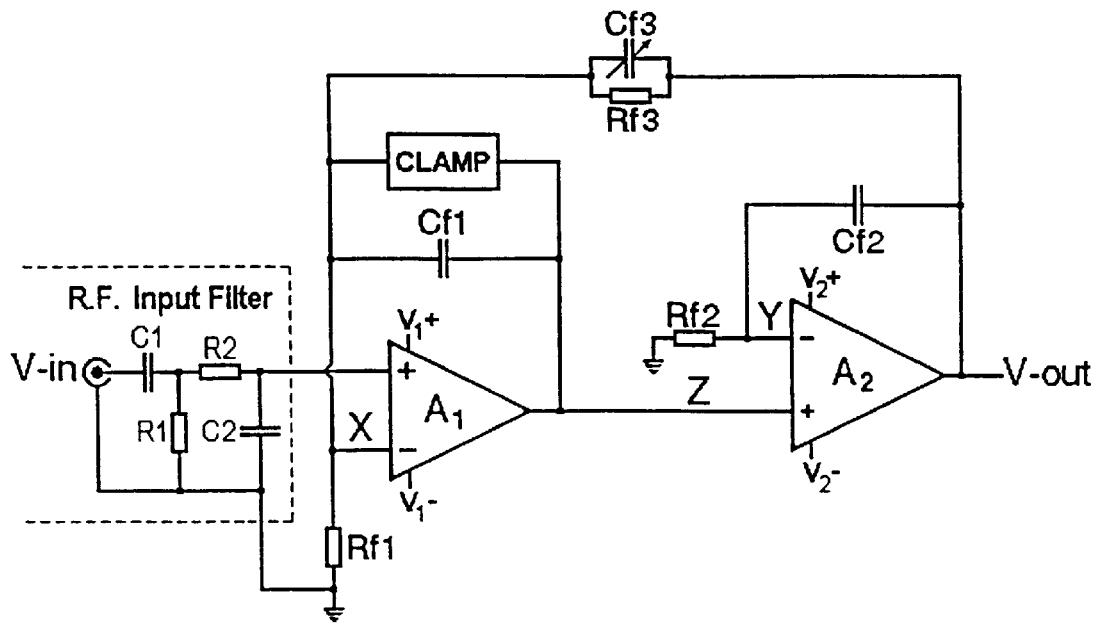
FIGS. 3a and 3b are examples of a most preferred first embodiment of the invention.
Figure 3B:
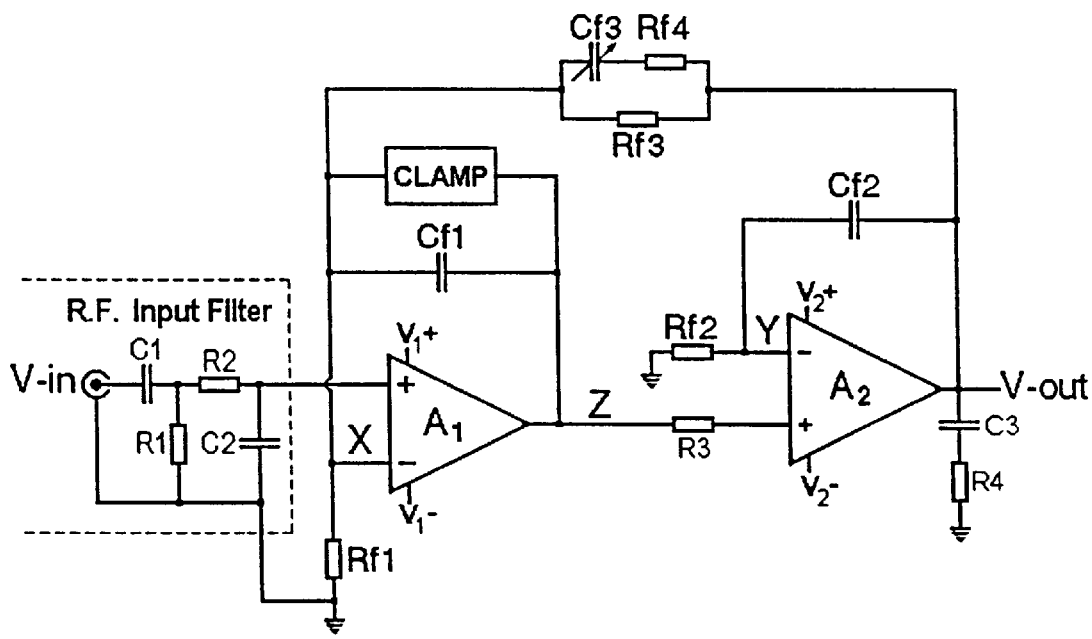

Referring now to FIGS. 3a and 3b there is shown two examples of an amplifying circuit according to a first embodiment of the invention for amplifying and input signal $V_{in}$ to an output signal $V_{out}$. An upstream first amplifying stage comprises a first operational amplifier $A_1$ and is connected in cascade through an intermediate point Z to a downstream second amplifying stage which comprises a second operational amplifier $A_2$. Feedback means is connected to amplifier $A_2$ and comprises a capacitor $Cf_2$ connected between the output of $A_2$ and the inverting input, together with a resistor $Rf_2$ connected between the inverting input of $A_2$ and ground. Further feedback means is connected across the first operational amplifier $A_1$, provided by a capacitor $Cf_1$ connected between the output of $A_1$ and the inverting input of $A_1$.

The configuration is non-inverting, the forward path of the amplifying circuit passing through the non-inverting inputs of both $A_1$ and $A_2$. The cascaded amplifiers are disposed within an outer DC loop connecting the output of the second operational amplifier $A_2$ to the inverting input of the first operational amplifier $A_1$. A resistor $Rf_3$ is connected within the outer loop, and a resistor $Rf_1$ is connected between the inverting input of $A_1$ and ground, thereby defining the DC closed loop gain of the amplifying circuit as approximately ($Rf_3/Rf_1+1$).

An outer loop damping component is provided by a capacitor $Cf_3$ connected in parallel to the resistor $Rf_3$, which reduces the closed loop gain at high frequencies. An input filter comprises resistors $R_1$ and $R_2$ and capacitors C1 and C2 is provided to filter out high frequency components of the input signal $V_{in}$.

The block labelled CLAMP denotes any suitable method of clamping the output of $A_1$. FIGS. 16a and 16f show a number of such realisations. In a preferred configuration for this embodiment, the arrangement of FIGS. 16e or 16f is used. The operation of such clamps is well understood and need not be described here. Of special importance in the invention is leakage current and non-linear capacitance in the clamp circuit. FIG. 16a puts A1 into its current limits but is generally satisfactory and LED's are similarly satisfactory (FIG. 16b). The method shown in FIG 16c has non-linear capacitance and is not very satisfactory for that reason. The method shown in 16d uses the B/E breakdown of small signal transistors and is usually satisfactory except the breakdown voltage of typical transistors is rather high (8 to 10 V). The method used in FIGS. 16e or f is most satisfactory—as rule of thumb, 5.6 volt Zeners generally suffice. Too small an excursion will inhibit slew on rail to rail square wave.

With no clamp the recovery from clipping is not so clean and the circuit can sometimes by triggered into a non-linear oscillation especially when there is coupling of output to input due to careless layout, or otherwise when the circuit is maladjusted.

Capacitor $C_3$ and resistor $R_4$ in FIG. 3b are to suppress local parasitic oscillations, and are commonly used on most power amplifiers. Resistor Rf4 and R3 in FIG. 3b suppress local parasitic oscillation especially in decompensated types such as the LM1875. These measures along with several others (eg input compensation) are well known and commonly resorted to.

Component values suitable for a power amplifier for audio amplification are given in Table 1 below.

TABLE 1

| Components for FIG. 3a | | |
|---|---|---|
| A1 = LF357 or preferably NE5534 | Rf1 = 560Ω | |
| A2 = LM12 | Rf2 = 100Ω | |
| | Rf3 = 27KΩ | |
| Cf1 = not less than 82 pF | | |
| Cf2 = 3n3 | R1 = 10KΩ | |
| Cf3 = 10–80 pF variable | R2 = 1KΩ | |
| C1 = ≈10 μF Bi-polar | V1± = ±15 Volts | |
| C2 = 100 pF (R.F. bypass only) | V2± = ±40 Volts | |
| CLAMP = FIG. 16e or f (preferably) | | |
| Components for FIG. 3b | | |
| A1 = LF357 or NE5534 | Rf1 = 560Ω | |
| A2 = LM1875 | Rf2 = 15Ω | |
| | Rf3 = 27KΩ | |
| Cf1 = 39 pF | Rf4 = 100Ω | |
| Cf2 = 1 nF | | |
| Cf3 = 5.5–60 pF variable | R1 = 10KΩ | |
| | R2 = 1KΩ | |
| C1 = ≈4.7 μF Bi-polar | R3 = 1KΩ | |
| C2 = 100 pF (R.F. bypass only) | R4 = 18Ω | |
| C3 = .022 μF | V1± = ±15 Volts | |
| CLAMP = FIG. 16e or f. (preferably) | V2± = ±25 Volts | |

The values $Cf_2$=330 pF and $Rf_2$=47Ω are also suitable— the values can be scaled in accordance with their voltage divider action between these limits.

Both circuits have a closed loop gain of 50. The gain for FIG. 3a is flat to about 25 KHz, and that for FIG. 3b is flat to about 40 KHz. Both can drive highly capacitive loads. Both are capable of rail to rail square wave with zero overshoot and settling time from slew limit. $Cf_3$ is adjusted to ensure this condition.

The operation of the above circuit of FIG. 3a or FIG. 3b with $A_2$ an integrated power operational amplifier is essentially the same when $A_2$ is a discrete power operational amplifier. Likewise, the operation is essentially similar when $A_2$ is a low level operational amplifier similar to $A_1$. Component values suitable for an instrumentation amplifier or a model test amplifier for investigating the invention are given in Table 2 below for FIG. 3a.

TABLE 2

| A1 = LF357 or NE5534 (decompensated) | Rf1 = 560Ω |
|---|---|
| A2 = LF357, LF356, NE5534, LM741 | Rf2 = 100Ω |
| | Rf3 = 27KΩ |
| Cf1 = 39–100 pF | Rf4 = 100Ω |
| Cf2 = 120 pF | |
| Cf3 = 5.5–60 pF variable | R1 = 10KΩ |
| | R2 = 1KΩ |
| C1 = ≈4.7 μF Bi-polar | R3 = 1KΩ |
| C2 = 100 pF (R.F. bypass only) | R4 = 18Ω |
| C3 = .022 μF | V1± = ±15 Volts |
| CLAMP = FIG. 16e or f. (preferably) | V2± = ±25 Volts |

Qualitatively the same improvement in performance of $A_2$ is observed in this example as in the power amplifier example described above, including ultra low output impedance across the bandwidth, extended power and bandwidth and enhanced linearity.

The stability conditions are behaviour characteristics can be investigated using a large variety of 8 pin Mini DIP operational amplifiers. The only limitation is that $Cf_2$ must be scaled to suit the current capacity of $A_2$, but this is never a problem in practice. For example, $Rf_2=100\Omega$, $CF_2=120$ pF is convenient for Mini DIPS. All points of the circuit can be attached to an oscilloscope, if necessary through a 1 K$\Omega$ resistor, without any significant disturbance. Provided $A_1$ is carefully laid out, and $Cf_2$ and $Rf_2$ are close to the pines of $A_2$, the rest of the circuit tolerates long (12 cm) leads and clipped-in modifications. For considerable output currents relative to $A_2$ current limits, the usual precautions on rail by-passing and single point grounding must be observed. The circuit is remarkably insensitive to intrusions of test gear.

A trimmer capacitor for $Cf_3$ is necessary for development work since different operational amplifiers as $A_2$ have different optima depending on their speed and other characteristics. Fast RF suboscillation of $A_1$ generally indicates $Cf_3$ is maladjusted. When $Cf_1$ is within a certain range (39 to 80 pF), $Cf_3$ is not particularly critical. Similarly the larger the value of $Cf_1$, the less critical is $Cf_3$. However $Cf_3$ must be within a narrow range for zero settling time on rail to rail square wave.

There are not places in the circuit where a linear (ie. non-differentiated) intermediate signal occurs. Only $V_{out}$ is linear with respect to $V_{in}$. The condition is not obvious with sine waves since the differentiated signals are still sinusoidal, but with square and triangular wave the intermediate signals are all virtually 100% differentiated. There are exceptions to this as discussed below for variants of the invention.

Closed loop frequency response with faster operational amplifiers can be made flat within 0.1 dB to beyond 50 kHz, with discrete Op. Amps for A2 beyond 200 KHz.

A careful adjustment of $Cf_1$ shows it has a slight regenerative effect on closed loop gain, and increasing its value, all else being equal, can shape the roll-off of closed loop gain to extend its flatness if so required. The reason is that the output of $A_1$ increases at 20 db/decade, and interacts via $Cf_1$ with the common mode signal on $A_1$'s input. The phase relations are intricate and need not be described here. The fast LF357 prefers a 1 K$\Omega$ resistor R3 in series with its inverting input.

$Cf_3$ controls recovery from slew limit, and optimal adjustment is for zero setting time on rail to rail square wave. When $Cf_1$ and $Cf_2$ are smaller than optimal, $Cf_3$ becomes progressively more critical for stability.

The absolute values of $Cf_2$ and $Rf_2$ are important, an should be such that $Cf_2$ is as large as convenient, and $Rf_2$ adjusted for a convenient AC gain for $A_2$. This is especially important if large capacitive loads have to be driven, compared with the current capacity of $A_2$. Local AC Gains for $A_2$ over 500 at 20 kHz are quite satisfactory with high gain decompensated Mini DIP's, while unity gain types will tolerate more AC feedback which tends to improve artefact correction.

The circuit does not behave in a way familiar from the usual construction of linear amplifiers and does not obey normal assumptions about circuit stability. In particular, $A_1$ works best when decompensated, for example an LF357 or NE5534N or NE5534AN (an LM318 as $A_1$ functions well but runs hot due to RF suboscillation. A series resistor to its inverting input would no doubt cure the trouble). However, unit gain compensated types work well in addition, such as OP27, NE5534AP or LF356. Compensating the NE5534AN is deleterious and superfluous. Since the same decompensated types work well as $A_2$ (an LF357 needs more care in layout and rail by-passing), compensating $A_2$ is usually deleterious with Mini DIP's. Similarly, DC feedback across $A_1$ or $A_2$ is deleterious to stability. DC feedback across $Cf_2$ does give $A_2$ a determinate DC gain (see for example FIG. 5), and adds a component of $V_{out}$ to the intermediate signal, thereby retarding its phase proportionally at any given frequency. The intermediate signal will then advance in phase and higher frequencies. Such DC feedback is always somewhat deleterious and does nothing useful in the circuit. Similarity, resistance feedback parallel to $Cf_1$ is always somewhat deleterious and performs no useful function. Discrete power operational amplifiers used as $A_2$ can have their own DC feedback resistors removed, and may require modifications to their internal compensation when used as $A_2$.

$A_1$ can alternatively be driven through $Rf_2$, turning the complete loop into an inverter with non-inverting input grounded. This connection is a convenient way to observe the difference signal at point X directly and measure open loop gain; much below 20 kHz the signal will be below the noise floor. The more usual method is indirect and does not shown the phase of the difference signal.

While the reason for the ultrastability of the amplifier is not entirely understood, it is believed that the phase advance provided by the differentiating feedback elements $C_2$ and $Rf_2$ is central to the reason for the unexpected stability and low distortion of this composite amplifier. Since the DC loop back to the summing junction of $A_1$ forces the entire loop to be linear, $A_1$ is forced to provide the differentiated common mode signal to the non-inverting input of $A_2$, along with the small difference signal to be amplified by $A_2$. Since $C_2$ and $Rf_2$ differentiate $V_{out}$, the signal at the intermediate point Z and the common mode signal for a sine way input is 90° advanced in phase with respect to the notional non-advanced phase, which for the non-inverting configuration of $A_2$ shown here is the phase of $V_{out}$.

It is an important but seldom noted fact that even in a resistive feedback circuit, the difference signal across the inputs of an operational amplifier is typically 90° advanced in phase. This may be understood by realising that the open loop gain of an operational amplifier typically drops at 20 dB per decade from a low frequency (0 to 1 kHz) and is therefore already quite close to an integrator in its open loop behaviour. It is believed that the performance of the invention may be understood in a broad sense by considering that $A_2$ is provided with an input signal which $A_2$ is naturally adapted to convert by its approximate open loop integrating function into the required linear output signal and therefore that A2 is more easily able to correct its own distortions which are presented at the appropriate point in the cycle. These factors appear to profoundly alter the joint operation of $A_1$ and $A_2$ in the circuit, making the composite considerably more stable than either amplifier in its local loop. This possible explanation is discussed in more detail below.

With some operational amplifiers e.g. LM12, $Cf_2$ can be removed, and the intermediate signal remains 90° advanced in phase. This can be understood by consulting the internal circuit diagram of the operational amplifier in question, which provides some capacitive feedback in its own compensation circuitry. It is also to be expected when one considers the general characteristic of operational amplifiers discussed above which is to act as approximate integrators in an open loop. With $Cf_2$ removed, the feedback components are effectively partly provided within the second amplifying stage and associated with rather than connected to the second amplifying stage, as described in the first broad aspect of the invention above. However, with $Cf_2$ removed, the operation is less reliable. In principle, the value of $Cf_2$ should preferably provide a convenient load on $A_2$.

It is also been found in a similar manner that in some circumstances $Cf_1$ may also be removed entirely, although this then makes the adjustment required for $Cf_3$ critical and the circuit is again difficult to adjust and unreliable.

The performance of this amplifying circuit for FIG. 3a and FIG. 3b is orders of magnitude better in all respects than previously known amplifier circuits used to drive power Op. Amps such as the LM12 or LM1875 from a low level signal. In this circuit, the LM12 requires no choke on the output when used as an audio amplifier as specified in the data sheets supplied with the LM12. An output lead of 0.5 m suffices for the amplifying circuit to drive unlimited capacitive loads to the limits of the protection circuitry of the LM12. Similarly, highly inductive loads can be driven to the power supply rails with square wave input at maximum current load, having observed the recommended precautions of clamp diodes on the output.

Crossover artefacts invisible on a normal cathode ray oscilloscope trace can be observed by differentiating $V_{out}$ as shown in FIG. 8, preferably with a delayed trace oscilloscope and at 20 kHz. For power amps, 0.047 $\mu$F and 27$\Omega$ are convenient for the differentiation—for mini Dips 100 pF–270 pF and 100$\Omega$. A convenient way to sustain the current out for long periods is to reduce the rails and run about 32 voltage peak to peak into 2.5$\Omega$. The artefacts are then viewed with 1 MHz components about 90% of their amplitude on the output and response rises 20 dB/decade, with crossover on the peaks. Thus viewed the $A_2$ artefacts are dramatically reduced compared to their size when A2 is in its own loop on its own, even as a voltage follower in the case of the LM12. Similar results with discrete power Amps for $A_2$, and with Mini Dips and low level discrete Op. Amps show that the invention reduces the distinctive cross-over artefacts to approximately the delay time of the loop in width—about 1 $\mu$s in the case of the LM12, and down to <0.2 $\mu$s in the case of faster discretes and many Mini Dips. While this kind of distortion is not the only factor determining the overall quality of sound, it is one of the most notorious and hardest to eliminate and forms a solid objective basis of comparison.

Dynamic behaviour of the circuit is evidenced objectively by the ultra low output impedance at 20 KHz and above, which is too low to measure reliably.

The audible enhancement of the LM12 and LM1875 in the embodiment of FIGS. 3a and 3b gives the amplifiers a quality rarely heard in even the best audio amplifiers, and never in the more common commercial varieties. Similar enhancement of performance has been obtained with discrete amplifiers. The performance of the LM12 and LM1875 when driven in several more orthodox ways has the kind of sound one would associated with, and expect from a mediocre HiFi amplifier.

The cost benefit of the embodiment of FIG. 3 is evident from its simplicity, yet it has a performance difficult to approach with orthodox designs, and not possible at all with integrated power operational amplifiers by previously known means. Another advantage is using integrated power operational amplifiers is the integral thermal and short-circuit protection; impossible to match in discrete designs.

There is reason to believe that the invention has error correction mechanisms inherent in it, over and above its high open loop gain. This will be discussed below in terms of Mini DIP operational amplifiers used as $A_2$, with simulated crossover distortion from two counter parallel diodes on the output, for the sake of easily reproducible comparisons.

The inventor has termed this amplifier the "j-loop", signifying the 90 degrees phase shift in this embodiment at the intermediate point (i.e. $\exp\{j\,\pi/2\}=j$).

Referring now to FIG. 4, there is shown notional approximate voltage levels for a sinusoidal input signal of 20 kHz at various points throughout the circuit of FIG. 3d. The input signal $V_{in}$ is 1.4 V peak to peak in phase with the output signal $V_{out}$ at 70 Voltage peak to peak, showing a gain of 50 at 20 kHz. The signal at the inverting input Y of $A_2$ is 1.3 V peak to peak and 90 degrees advanced with respect to $V_{out}$. Similarly, the signal at the intermediate point Z on the forward path is also 90 degrees advanced and 2.0 V peak to peak. This gives by subtraction a difference signal of 0.7 volts peak to peak, showing the open loop gain of the LM12 circuit to be 100 at 20 KHz.

Figure 5:
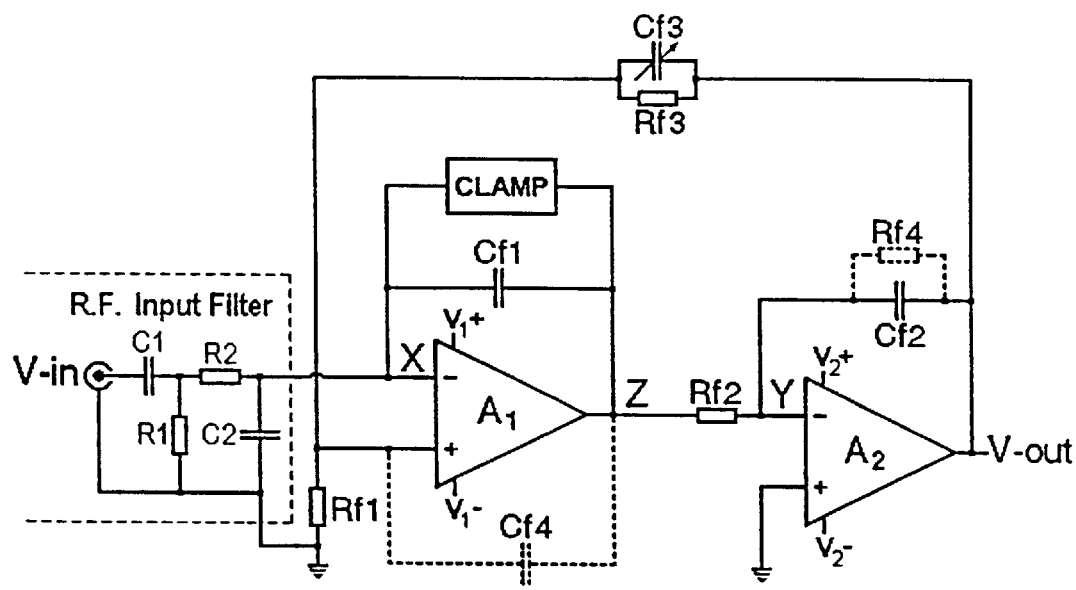
FIG. 5 is a circuit diagram showing an alternative second embodiment of the invention.

A second embodiment of the invention is realised by constructing an inverting-version equivalent of FIG. 3, as shown in FIG. 5. Component values are given in Table 3 below for a miniDIP version.

TABLE 3

FIG. 5 Component Values

| | |
|---|---|
| A1 = LF357 or NE5534 | R1 = 560$\Omega$ |
| A2 = NE5534 | Rf2 = 100$\Omega$ |
| | Rf3 = 27K$\Omega$ |
| Cf1 = 39 pF | Rf4 = as convenient |
| Cf2 = 270 pF | |
| Cf3 = 5.5–60 pF variable | R1 = 10K$\Omega$ |
| Cf4 = <12 pF | R2 = 1K$\Omega$ |
| C1 = ≈4.7 $\mu$F Bi-polar | V1± = ±15 Volts |
| C2 = 100 pF (R.F. bypass only) | V2± = ±40 Volts |
| CLAMP = FIG. 16e, 16f (preferably) | |

A power of amp can also be substituted for NE5534 as $A_2$ with adjustments to the other components.

The notional non-advanced phase is 180 degrees out of phase with $V_{out}$, since the intermediate voltage signal is fed into the inverting input of $A_2$.

The practical operation of the embodiment of FIG. 5 is almost the same as the embodiment of FIG. 3, the differs in detail. R2 reflects the operation of $Cf_1$, since the two form a C/R divider. Raising the value of either $Cf_1$ or R2 regenerates closed loop gain proportionally, above 20 kHz. When this effect is considerable, ie when $C_1$ is too large or R2 is too large, it can be reversed by a small (approximately 12 pF) capacitor shown as $Cf_4$ from $A_1$'s output to its non-inverting input. If $Cf_4$ is much larger than 12 pF, $A_1$ becomes prone to peculiar RF oscillation in the MHz region, yet surprisingly the output is almost normal and can drive a load speaker if $A_2$ is a power operational amplifier. $A_1$ seems to phase modulate the RF, and somehow the circuit can produce an almost normal output. The same can happen when $Cf_2=0$ as mentioned above. This anomaly is noted as a curiosity which may well have a useful application.

As far as error correction is concerned, the artefact correction of $A_2$ does not seem to be as effective in the embodiment of FIG. 5 compared with the embodiment of FIG. 3, although otherwise the arrangement is satisfactory. However because $A_1$ must drive the current flowing through $Cf_2$ through $Rf_2$ a limitation on $Cf_2$ is imposed. For this reason alone performance is compromised and becomes a more serious penalty the higher and faster the output swing of $A_2$. In the embodiment of FIG. 3, $A_1$ operates at no load conditions and the rail voltage of $A_2$ or output swing is not a consideration.

Either the version shown in FIG. 3 or FIG. 5 can obviously be altered so that the entire loop is inverting. However low input impedance provided by $Rf_1$ becomes undesirable.

Offset provisions are particular to the operational amplifier which is chosen as $A_1$. A 200 kΩ pot suits LF357 and NE5534 (at different pins). LF357 and NE5534 have been found to be the most suitable operational amplifiers for $A_1$ either in the instrumentation model of Table 2 or in the power version specified in Table 1.

Figure 6:
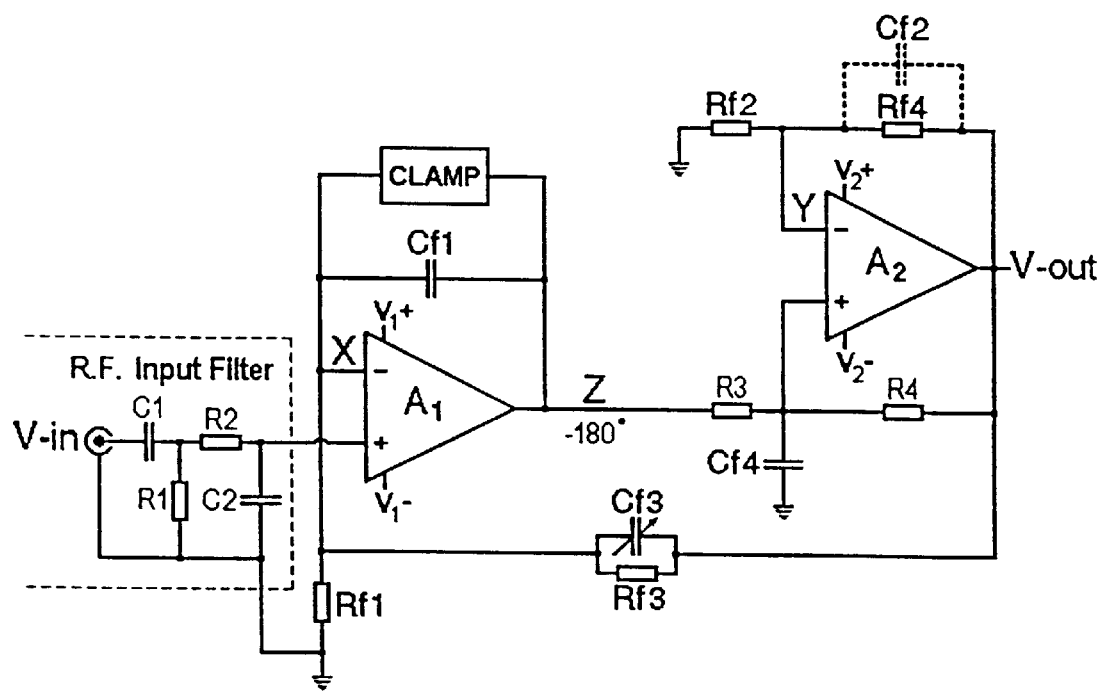
FIG. 6 shows a variation with the second amplifying stage realised as a deBoo integrator.

Referring now to FIG. 6, the second amplifying stage also works when $A_2$ is configured as a deBoo integrator. Component values are given in Table 4 below.

TABLE 4

FIG. 6. Component Values

| | |
|---|---|
| A1 = LF357 or NE5534 | Rf1 = 560Ω |
| A2 = NE5534 | Rf2 = 100Ω |
| | Rf3 = 27KΩ |
| Cf1 = not less than 39 pF | Rf4 = *10KΩ |
| Cf2 = 120 pF | |
| Cf3 = 5.5–60 Pf variable | R1 = 10KΩ |
| Cf4 = 270 pF (integrating capacitor) | R2 = 1KΩ |
| | R3 = *100Ω |
| C1 = ≈4.7 µF Bi-polar | R4 = *10KΩ |
| C2 = 100 pF (R.F. bypass only) | V1± = ±15 Volts |
| CLAMP = FIG. 16e or 16f (preferably) | V2± = ±15 Volts |

The notional non-advanced phase is the phase of $V_{out}$, since the intermediate voltage signal is fed into the non-inverting input of $A_2$.

The performance is very inferior, but the principle of operation is essentially similar. The same circuit works without $Cf_4$ by virtue of the internal compensation provided within $A_2$, the phase at the intermediate point Z remaining 90° advanced. In this condition, $Cf_3$ is again quite critical. The circuit is improved in performance when $Cf_2$ is placed in the position shown in FIG. 3 across $R_2$ as shown dotted in FIG. 6.

Since the DC feedback across $A_2$ is balanced, it merely imposes a common mode signal on the inputs of $A_2$ of $V_{out}+100$, while at Z the voltage signal is still 90° advanced, even with no $Cf_2$ provided. This variation suggests that $A_2$ might be made into a voltage to current converter in this embodiment, with the signal at Z reflecting load current.

Figure 7:
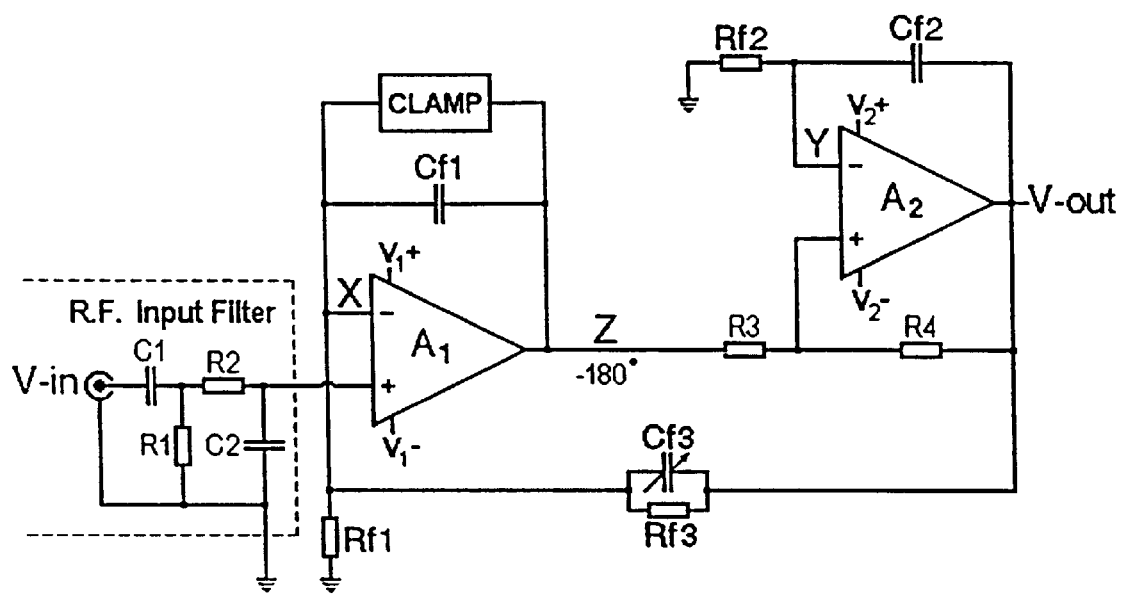
FIG. 7 shows a further variation utilising positive DC feedback.

A further useful variation utilising positive DC feedback is shown in FIG. 7. Component values are given in Table 5 below.

TABLE 5

FIG. 7. Component Values

| | |
|---|---|
| A1 = LF357 or NE5534 | Rf1 = 560Ω |
| A2 = NE5534 | Rf2 = 100Ω |
| | Rf3 = 27KΩ |
| Cf1 = 39 pF | |
| Cf2 = 120 pF | R1 = 10KΩ |
| Cf3 = 5.5–60 pF variable | R2 = 1KΩ |
| | R3 = *100Ω |
| | R4 = *10KΩ |
| C1 = 4.7 µF Bi-polar | |
| C2 = 100 pF (R.F. bypass only) | V1± = ±15 Volts |
| CLAMP = FIG. 16e/f (preferably) | V2± = ±15 Volts |

At low frequencies, the signal at Z is 180° advanced compared with $V_{out}$. At a frequency of about 25 kHz, when the feedback provided by $Cf_2$ begins to predominate, the voltage signal at Z progressively retards from the 180° position to about 100° advanced at 200 kHz. The relevant "notional non-advanced phase" as defined in the broad aspect of the invention is the phase of $V_{out}$, since the intermediate voltage signal is fed into the non-inverting input of $A_2$. Accordingly, the phase advance with respect to this notional phase is 100° at 200 kHz, and 180 degrees at 25 kHz or lower.

As may be expected from considering the behaviour of $A_2$ at low frequencies, the voltage divider feedback provided to the non-inverting input dominates at low frequencies and $A_2$ behaves as an inverting amplifier. Surprisingly, the output of the entire amplifier is still linear and non-inverting even though $A_1$ is in a non-inverting configuration. Consistent with this picture, the signal at Z is flat from DC to about 25 kHz, and is not differentiated. With this embodiment, $A_2$ may be given a determinate local DC loop gain without retarding the signal at Z, unlike the resistor $Rf_4$ in FIG. 3b, but rather advancing the signal a further 90° across most of the bandwidth. This embodiment does extend the power bandwidth somewhat and otherwise behaves exactly the same as the preferred version.

The signal at point X, when viewed directly by making the loop invert by driving it through $Rf_1$, is about 45° advanced in phase with respect to $V_{out}$ at 200 kHz. Stability seems to be in no way affected, but there is no obvious enhancement in performance and no clearly discernible advantage over the simpler preferred version of FIG. 3.

The above investigations suggest that the substantial phase advance which remains substantial under current load is the major contributing factor to the stability and low distortion. It may be conjectured that any feedback induced transfer function for $A_2$ which lags naturally in phase will advance the intermediate signal at Z when inside the DC loop with $A_1$, and will be stable for some range of values of $Cf_1$ and $Cf_3$, given a practical 1/β for $A_2$ at 20 KHz. Phase advances of 180° have proved quite reliable. Experiments along these lines were terminated when none showed any extended usefulness beyond that easily available with the simpler embodiments of FIG. 3.

A third cascaded Op. Amp can be added in several ways which suggest themselves from the examples given, although again no such possibilities have been found to enhance the performance of the simple embodiments of FIG. 3.

Figure 8A:
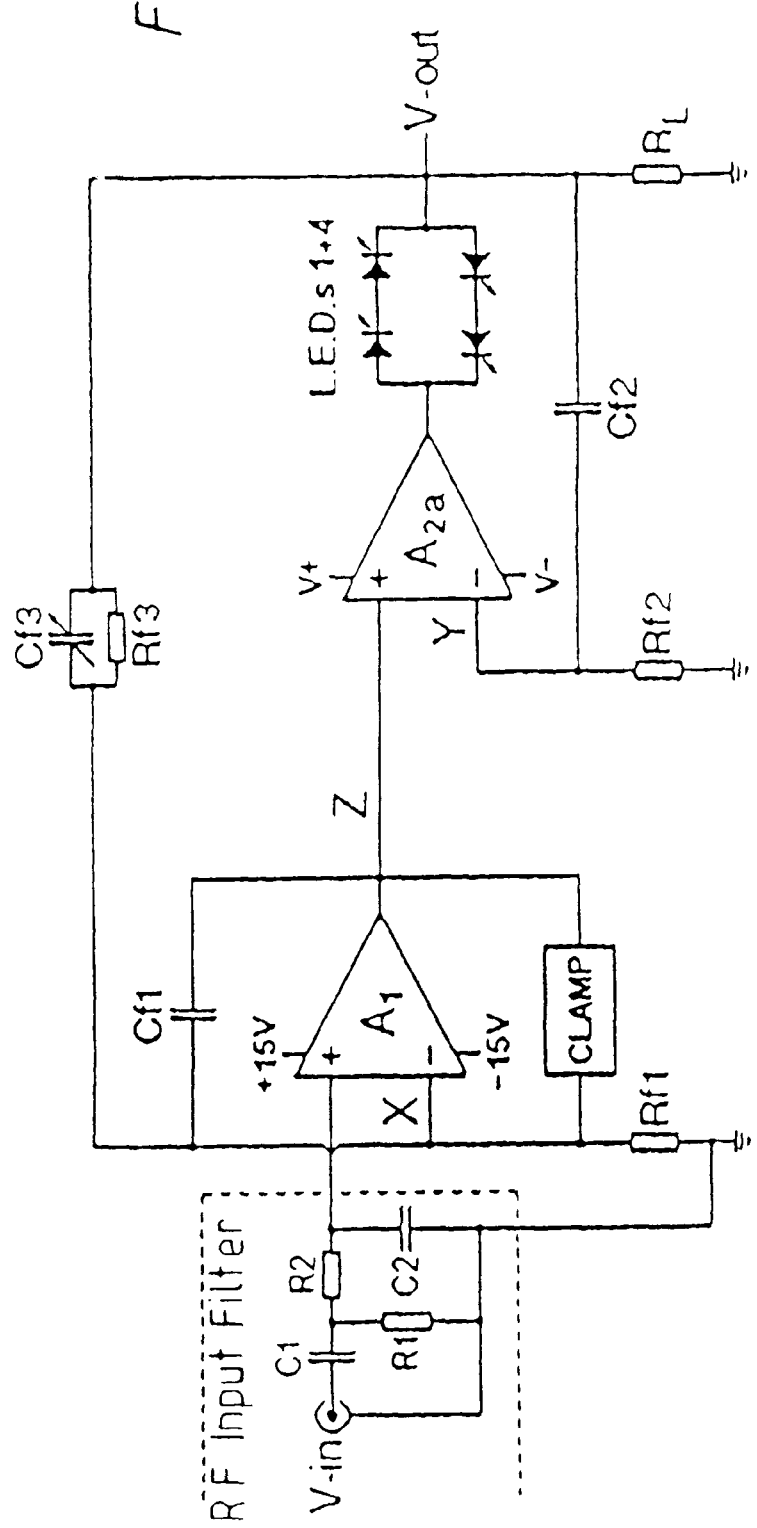

The effectiveness of error correction in any of the above embodiments of the invention can be checked by simulating crossover distortion with two diodes in the loop and $R_L$=1 KΩ or 600Ω depending on the I.C. used as $A_1/A_2$ output 30 Vpp, as shown in FIG. 8b. FIG. 8c shows an alternative with two transistors $Q_1$ and $Q_2$ (BD139 and BD140) as emitter followers on the output which has essentially the same effect, but with reduced $V_{BE}$ drop out. Where $A_2$ is a fast Mini DIP operational amplifier, ie. LM318, LF357 or NE5534, the crossover artefact can be reduced to 0.1 µs wide, with slower types of operational amplifier crossover artefact is wider. As this speed, the effectiveness of error correction is limited by the speed of $A_2$ and its gain, because 0.1 µs is approximately the transit delay of the loop. Reducing the speed of $A_1$ with $C_1$ actually improves correction because the error signal reverses phase and causes overshoot inside 0.1 µs. If $A_2$ is a power amplifier, it behaves in a similar but more complex manner with a real load eg. (2.5Ω±15 V, 20 kHz). FIG. 8a shows the extreme drop-out (±4 volts) which fast low level $A_2$'s can correct, even down to outputs of a few millivolts. Even quite simple discrete Op. Amps are much superior to any mini Dip's in this regard, and can then function with next to no frequency compensation as $A_2$.

To check the operation of $Cf_2$, a single operational amplifier (an NE5534) was put in its own loop with the same two diodes, as shown in FIG. 8d. The effectiveness of its error correction is inhibited by any capacitor directly from the output of the NE5534 to its inverting input. Installing $Cf_2$ as shown emerging from the output of the diodes dramatically improved the correction. The correction of the artefact increased in proportion to the value of $Cf_2$, but of course either the amplifier oscillates or the roll off of closed loop gain becomes intolerable at some value of $Cf_2$, and this is one reason why a useful audio amplifier cannot be produced without the first amplifying stage comprising $A_1$ to boost the open loop gain of the circuit and stabilise $A_2$, thereby extending the linear range of the amplifying circuit.

Since a single pole compensated operational amplifier demands an appropriate differentiated difference signal, even resistive feedback must supply this in order to keep the loop linear as observed over a large range. The minute error on the output only becomes significant in the correction of artefacts and is then decisive. In order to correct an artefact, the feedback must supply the differentiated form of the artefact, because the operational amplifier is in reality an approximate integrator and requires to be supplied the differential of the artefact in order to raise the requisite error signal to correct the artefact on the output. Typically the worst artefacts in a power operational amplifier come from the output stage especially at cross-over, while the dominant pole feedback capacitor is taken usually from the driver stage and actually inhibits the requisite error signal. It is this capacitor which swamps the Miller capacitance and other mechanisms causing phase lag of $V_{out}$ at high frequencies. From this it is clear that the invention supplies $A_2$ with the differentiated error signal precisely as $A_2$ demands. This reduces the role of $A_2$'s internal dominant pole capacitor to local feedback for internal stability, since its effect on $A_2$'s open loop gain is somewhat negated when $A_2$ is driven by the differential of the requisite of $V_{out}$. When the artefacts of $A_2$ are considered, $A_1$ supplies to the non-inverting input of $A_2$ the inverse of the visible differentiated artefact from $Cf_2$ on the inverting input. This is only visible of course when the artefact is very fast and steep such as in crossover distortion of the worst kind, where correction is at the limits of the speed of the loop.

It follows that resistive feedback cannot supply the differential of the artefact as required for the operational amplifier to raise an inverted error signal of the same shape and phase as the artefact. It requires in other words a differentiated error signal. Consequently, distortion on the output of a single pole operational amplifier tends to rise at 20 dB per decade of frequency from about 100 $H_z$ when the difference signal at its input is typically 90° advanced in phase. This imposes a fundamental limitation on the correction of artefacts in a single pole feedback loop of the usual kind, apparently over and above the better known limitation on open loop gain imposed by Bode/Nyquist stability problems.

A more realistic way of thinking of differentiation is that it fundamentally concerns rate of change rather than size of the signal. Resistive feedback is purely a size or a proportioning function. Consequently, $A_2$ having only pure AC feedback from $Cf_2$ has no determinate DC offset, yet remains as determined by the loop because any change is detected by $Cf_2$ and the required offset is determined by the resistive outer loop. Dynamically, $Cf_2$ monitors the rate of $V_{out}$ whatever its size, while $A_1$ monitors the size of $V_{out}$ and corrects $A_2$ accordingly. When it comes to the correction of artefacts, the resistive outer loop (neglecting $Cf_3$) supplies the difference signal to the negative input of $A_1$ in phase with $V_{out}$ and hence in phase with the artefact, while $Cf_2$ feeds back to the input of $A_2$ the differentiated artefact, as required by $A_2$ to correct the artefact on the output. The operation is not instantaneous, and can be observed with a delayed trace oscilloscope on the real or simulated crossover artefact. Its width depends primarily on the transit delay of $A_2$ so far as the limit of correction is concerned. By maladjusting the loop, it can be made into the usual notch.

The invention therefore, apart from its very high open loop gain, has peculiarly effective correction mechanisms. not least is that with $A_1$ on regulated rails, the net rail rejection is radically enhanced, and the L.F. thermal effects in IC Power OP. Amps eliminated.

The net result when $A_2$ is a power operational amplifier, and all the well known precautions are observed, is a startling clarity of sound, the more striking at high volume. Typical conventional audio amplifiers are often overpowered or also given much larger current capacity then strictly required, in order to minimise distortions at high volume. In the current invention such steps are superfluous, and there is no evidence of distortion near maximum power: hence quite low powered embodiments of the current invention have been remarked to sound as if they were much higher power.

The invention may also be realised with amplifiers in either the first or second stages made from discrete components and which are not in themselves operational amplifiers. FIG. 9 shows a version of the invention where the second stage is composed entirely from discrete components. Component values are given below in Table 6.

TABLE 6

FIG. 9. Component Values

| | |
|---|---|
| A1 = LF357 or NE5534 | D1 = L.E.D |
| | D2 = L.E.D |
| Q1 = BC327 | D3 = 1N914/1N4148 |
| Q2 = BC337 | D4 = 1N914/1N4148 |
| Q3 = BD139 | D5 = 1N914/1N4148 |
| Q4 = MJE350 | D6 = 1N914/1N4148 |
| Q5 = BD139 | D7 = 1N5404 |
| Q6 = BD140 | D8 = 1N5404 |
| Q7 = MJE340 | Rf1 = 560Ω |
| Cf1 = 39 pF | Rf2 = 100Ω |
| Cf2a/b = 330 pF | Rf3 = 27KΩ |
| Cf3 = 5.5–60 pF variable | R1 = 10KΩ |
| C1 = ≈4.7 μF Bi-polar | R2 = 1KΩ |
| C2 = 100 pF (R.F. bypass only) | R3 = 6.8KΩ |
| C3 = 0.05 μF | R4 = 100Ω |
| C4 = 0.05 μF | R5 = 100Ω |
| C5 = 33 μF | R6 = 100Ω |
| C6 = 33 μF | R7 = 18Ω |
| C7 = 0.047 μF | R8 = 18Ω |
| C8 = 0.047 μF | R9 = 100Ω |
| C9 = 1 μF | R10 = 1.8KΩ |
| C10 = 1 μF | R11 = 1.8KΩ |
| C11 = 1 μF | R12 = 270Ω |
| C12 = 0.015 μF | R13 = 270Ω |
| | R14 = 100Ω |
| CLAMP = FIG. 16e/f(preferably) | R15 = 100Ω |
| | R16 = 15Ω |
| Rv1 = 200KΩ | R17 = 15Ω |
| Rv2 = 500Ω | R18 = 15Ω |
| | R19 = 27Ω |
| V1± = ±15 Volts | V2± = any voltage within transistor ratings. |

The circuit is essentially identical in function to the embodiment of FIG. 3, where internal wave forms at points X, Y and Z behave analogously to FIG. 3. The circuit differs only in its limited transconductance compared with operational amplifiers, which causes 90° phase advance under no load conditions to be reduced to about 45° at maximum load conditions.

The adaptor stage before the VBE multiplier provides $A_2$ with a symmetrical non-inverting input. The notional non-advanced phase is therefore the phase of $V_{out}$. The adaptor stage converts the dual positive inputs of $A_2$ (bases of Q5 and Q6 to a single positive line. The multiplier will be about 1.4 volts at most when quiescent current in the output transistors is a convenient 10 to 20 mA. The adaptor stage supplies current in the VBE multiplier and 1 or 2 mA into the two diodes shunting. A small load may be necessary for stability; component values are approximately 1 nF and 100Ω.

The clamp on the IC1 output limits its discursion on clipping. The diodes (D7, D8, D9 and D10) at the junction limit the current on clipping, otherwise unlimited current would flow down the totem pole. Alternatively, the 2 diodes at the junction can be replaced by 4 as shown in FIG. 10. Their action is different but equivalent. Transistors can be used but are less convenient.

Diodes across the output devices clamp transients from inductive loads.

For temperature compensation of output quiescent current, all transistors in the totem pole and the VBE multiplier are mounted on the same heat sink as close as possible to each other.

The emitters of Q5 and Q6 effectively form the inverting input of $A_2$. Feedback resistor $Rf_2$ is formed equivalently by the three junction resistors R16, R17 and R18. $Cf_2$ feedback capacitors, $Cf_{2a}$ and $Cf_{2b}$, are more effective direct from $V_{out}$ to the emitters of totem pole transistors Q5 and Q6 at the junction, than a single capacitor connected from $V_{out}$ to the centre of the junction "T", (which nevertheless does work). Any DC feedback from $V_{out}$ whatsoever is deleterious in all respects. It retards the phase of the signal into $A_2$, and reduces stability margins and performance.

On current load, the signal into $A_2$ retards proportionally depending on frequency and load, due to the limited transconductance of the stage, determined largely by the three resistors in the "T" of the junction. Two resistors connected directly to ground from the emitters will cause instability. The relative values of three resistors in the "T" seems best for crossover when they are equal. Their effect on crossover distortion is easily observed from the signal to $A_2$ under varied loads. However changing their values requires readjustment either of quiescent current, or the values of $Cf_2$, or both. Similarly the bleed resistors (270Ω) across the base/emitter junction of the output transistors are critical for the quiescent current setting. The values of $Cf_2$ at 330 pF each are satisfactory but can be increased. The RC load on the output may be necessary with some layouts for RF stability. Likewise, small capacitors across the base/emitter resistors of the output devices, though unnecessary, will supply local compensation. Any capacitance from the base of the output device to its collector is undesirable and unnecessary.

It is possible to take the third resistor in the "T" at the junction to the output instead of ground, and thus turn the output stage into a unity-gain follower (with $Cf_2$ removed). This merely illustrates how the stage resembles an operational amplifier.

When supplied with current boosters on the output, or with the output transistor made a "Darlington", the stage is capable of very large output currents. SOA provisions are then necessary as is obvious. With the constants shown, $A_2$ will have a voltage gain of about 500 at 20 kHz determined primarily by the values of $C_2$ and the resistors in the junction. Thereafter no-load gain falls at 20 dB per decade. With the values shown, $C_3$ is decisive for stability and must be a trimmer capacitor as shown (0 to 50 pF approximately). Open loop gain will measure about 110 dB at 20 kHz, depending on the type of operational amplifier used as $IC_1$ ($A_1$).

Power supplies to $A_2$ (V+ and V-) may be anywhere within the voltage ratings of the transistors used. Powering up requires the usual precautions, ie. 10 or 20Ω resistors in series with the high voltage rails, and VBE multiplier wound back to minimum volts, or pre-set below twice the VBE.

Referring now to FIG. 11, there is shown a further embodiment with both amplifier stages constructed from discrete components. Component values are given in Table 7 below.

TABLE 7

FIG. 11. Component Values

| | |
|---|---|
| Q1/Q7 = LM394(or matched BD139's insulated and bolted together collector to collector for thermal coupling) | Rf1 = 560Ω |
| Q2/Q3/ = NTE2322(or matched Q5/Q6 BF470's) | Rf2 = 51Ω |
| Q4 = BC639 | Rf3 = 27KΩ |
| Q8 = BD140 | |
| Q9 = BD140 | R1 = 10KΩ |
| Q10 = BD139 | R2 = 1KΩ |
| | R3 = 18KΩ |
| Cf1 = ≈30 to 80 pF | R4 = 15Ω |
| Cf2 = 120 pF | R5 = 100Ω |
| Cf3 = 5.5–60 pF variable | R6 = 10Ω |
| | R7 = 560Ω |
| C1 = 4.7 µF Bi-polar | R8 = 100Ω |
| C2 = 100 pF (R.F. bypass only) | R9 = 15Ω |
| C3 = 33 µF | R10 = 100Ω |
| C4 = 33 µF | R11 = 10Ω |
| C5 = 47 nF | R12 = 18KΩ |
| | R13 = 5.6KΩ |
| D1 = 1N914/1N4148 | R14 = 4.7KΩ |
| D2 = L.E.D. | R15 = 5.6KΩ |
| D3 = 1N914/1N4148 | R16 = 100Ω |
| D4 = 1N914/1N4148 | R17 = 100Ω |
| D5 = L.E.D. | R18 = 10KΩ |
| D6 = 1N914/1N4148 | R19 = 220Ω |
| D7 = L.E.D. | R20 = 66Ω |
| D8 = L.E.D. | R21 = 33Ω |
| D9 = L.E.D. | Rv1 = 200Ω |
| CLAMP = FIG. 16e/f(preferably) | V± = ±18 Volts |

The schematic diagram shows the circuit as in breadboard merely to check the concept. By changing $Cf_2/Rf_2$ the second stage gain can be manipulated, and optima for $Cf_1$ and $Cf_3$ changed systematically. The 6.5Ω resistor and 0.01 µF capacitor are probably deleterious, but act as a current limit for the transistor, in conjunction with the LED clamp across the first stage, with reduces clipping transients at high frequencies.

Each stage has a 20 dB/decade slope of gain. Open loop gain can range grate than 96 dB at 20 kHz driving a 1.5Ω load with 30 volts peak to peak. The circuit drives any size capacitor and ramps up and down on its current limits. Power band extends beyond 200 kHz.

Referring now to FIG. 12, this shows a simplified rudimentary version with high gain discrete stage for the second amplifying stage. Component values are given in Table 8 below.

TABLE 8

FIG. 12. Component Values

| | |
|---|---|
| A1 = LF357 or NE5534 | D1 = 1N914/1N4148 |
| | D2 = 1N914/1N4148 |
| Q1 = BC639 | D3 = 1N914/1N4148 |
| Q2 = BD140 | D4 = L.E.D. |
| Q3 = BD139 | Rf1 = 560Ω |
| Cf1 = not less than 39 pF | Rf2 = 100Ω |
| Cf2 = 120 pF | Rf3 = 27KΩ |
| Cf3 = 5.5–60 pF variable | R1 = 10KΩ |
| C1 = ≈4.7 μF Bi-polar | R2 = 1KΩ |
| C2 = 100 pF (R.F. bypass only) | R3 = 270Ω |
| | R4 = 10KΩ |
| | R5 = 100Ω |
| | R6 = 100Ω |
| V1± = ±15 Volts | V2± = any voltage within transistor ratings |

The transistor Q1 has attached an emitter resistor (Rf$_2$) which limits the stage transconductance and sets the AC voltage gain (at low load) to about $1/(2\pi FCR)$. On current load, depending on the current gain of Q2, the voltage at Z retards in phase from 90° advanced since a component of in-phase voltage is added to the no-load signal, proportional to output current. However, the phase advance remains substantial even under maximum output current. The diodes D2 and D3 across the base emitter junction of Q1 are necessary to limit the current of Q1 on positive clipping, and the other diode D1 to clamp A$_1$ on its negative clipping excursion. Such a crude clamp arrangement suffices and of course might be refined as shown in the FIG. 16 variations. A 100Ω resistor may be necessary in series with Cf$_2$. Transistor Q2 should be current limited since it can source considerable current. Within its limitations, the second amplifying stage has comparable open loop voltage gain at no load to an operational amplifier, and behaves quite similarly. Analogous stages in the prior art usually put Q1 and Q2 in a local DC loop with a resistor across or in place of Cf$_2$, whose differentiated component of V$_{out}$ is swamped by the in-phase DC feedback, and the stage has a predictable gain at DC.

If Q$_1$ were made the positive side of a differential stage (long-tailed pair) and Cf$_2$/Rf$_2$ junction connected to the negative side base, the whole stage becomes a rudimentary operational amplifier, and the entire circuit a version of FIG. 3. Such an operational amplifier as A$_2$ would require a small capacitor from collector/base of the negative side transistor for local stability, or else a conventional dominant pole capacitor. Thus, when any of the discrete variations are developed to increase their performance, and overcome their limitations, the simplest and most effective terminus of development is to make them complete stand alone operational amplifiers, and embody the invention in either the preferred form of FIG. 3, or the variant of FIG. 5.

Referring now to FIG. 13 there is shown an additional feedback loop which was useful in earlier experiments with the invention, but proved eliminable once the behaviour of the invention was better understood. Though it proved to be unnecessary the additional loop may be useful in some applications. Component values are given in Table 9 below.

TABLE 9

FIG. 13. Component Values

| | |
|---|---|
| A1 = LF357 or NE5534 | D1/2 = 1N5404 |
| A2 = a discrete Op. Amp | Rf1 = 560Ω |
| Cf1 = 39 pF | Rf2 = 100Ω |
| Cf2 = 270 nF | Rf3 = 27KΩ |

TABLE 9-continued

FIG. 13. Component Values

| | |
|---|---|
| Cf3 = 5.5–60 pF variable | Rf4 = 100Ω |
| C1 = ≈4.7 μF Bi-polar | R1 = 10KΩ |
| C2 = 100 pF (R.F. bypass only) | R2 = 1KΩ |
| C3/4 = 4K7 μF | |
| C5/6 = 0.05 μF | Rv1 = ≈200KΩ |
| | V1± = ±15 Volts |
| CLAMP = FIG. 16e/f(preferably) | V2± = ±40 Volts |

When A$_1$ is an NE5534, pin 8 is the compensation pin, normally used only for offset adjust in the invention. When A$_1$ is an LF357, pin 5 can be used for both purposes also, although its specifications do not mention this capability.

The 39 pF in series is a precaution against leakage on high voltage rails—the 100Ω resistor may be useful and certainly serves to separate V$_{out}$ from such sensitive tracks. The effect of even 1 pF in the additional loop from V$_{out}$ is easily detectable by its effect on open loop gain (with a 200 kΩ offset potentiometer). This feedback loop also seems to aid the correction of very fast artefacts. While the functioning of this additional loop has not been fully investigated, its effect is global, and certainly stabilises A$_2$, along with A$_1$ when the loop is maladjusted or A$_1$ and A$_2$ has local instabilities under some conditions.

If A$_2$ is run as an inverter, the function of this subsidiary loop is not understood and has not been researched.

For powers beyond the capability of integrated power operational amplifiers, the invention suggests that discrete power operational amplifiers can be designed expressly to operate as A$_2$ in FIG. 3 or FIG. 5; the input stage can be simplified and run at higher current since its bias and offset currents are much less important when A$_1$ controls offset stability and drift, and input currents of 10's of μamps are tolerable. In some existing configurations the input stage can be eliminated altogether, for example, when the second stage is a pair of symmetrical differential stages of opposing polarity. The advantages are then radically enhanced performance with a smaller parts count, reduced assembly time, and simpler setting up procedure since A$_1$ and A$_2$ can be separately checked in their own loops.

FIG. 15 shows the voltage amplifier of an Op. Amp expressly designed to run as A2 in the invention, as shown. The compound transistors in the 2nd stage are not strictly necessary, but much enhance linearity and gain, and enable FET source followers to be driven directly, or with addition of emitter followers. In either case a standard VBe multiplier freestanding proved much superior to other methods of biasing FET source followers. Likewise a similar circuit proved to drive integrated darlingtons with power bandwidth beyond 200 KHz.

More conventional discrete Op. Amps have been tried and results highlighted the compromises built into them for the sake of stand alone operation eg. small current in 1st stage, and single pile compensation. Consequently consideration was given to arriving at the simplest configuration for extreme specifications to serve as A2 in the invention—and by product was the unconventional frequency compensation, most of which primarily affects parasitic suppression.

The version of A2a shown in FIG. 15 was stable in its own loop: though its input currents are rather high comparatively, they are immaterial when inside the loop of the invention.

Component values are given in Table 10 below.

TABLE 10

FIG. 15. Component Values

| | |
|---|---|
| A1 = LF357 or NE5534 | Rf1 = 560Ω |
| | Rf2 = 47Ω |
| A2a = | Rf3 = 33KΩ |
| Q1/Q4 = BF469 | R1 = 10KΩ |
| Q2/Q5 = BC549c | R2 = 1KΩ |
| Q3 = BF469/MJE340 | R3 = 5.6KΩ |
| Q6/11 = BF470/MJE350 | R4 = 620Ω |
| Q7/9 = BF469/MJE340 | R5 = 100Ω |
| Q8/10 = BF469/MJE340 | R6 = 470Ω |
| | R7 = 3.3KΩ |
| Cf1 not | R8 = 1KΩ |
| less than 2 39 pF | |
| Cf2 = 560 pF | R9 = 620Ω |
| Cf3 = 0–70 pF variable | R10 = 470Ω |
| | R11 = 5.6KΩ |
| C1 = 4.7 μF Bi-polar | R12 = 100Ω |
| C2 = 100 pF (R.F. bypass only) | R13 = 100Ω |
| C3 = 100 pF | R14 = 120Ω |
| C4 = 100 pF | R15 = 100Ω |
| | R16 not less than 2 33Ω |
| CLAMP = FIG 16e/f(preferably) | R17 = 100Ω |
| D1 = 15 Volt Zener | R18 = 100Ω |
| D2/3 = 1N914/1N4148 | R19 = 100Ω |
| D4 = 5.6 Volt Zener | R20 = 120Ω |
| L1 = 470 μH | V1± = ±15 Volts |
| L2 = Ferrite Bead (or any voltage within transistor ratings) | V2± = ±40 Volts |

FIGS. 4a, b and c show ways of advancing the intermediate signal a further 90° C. FIG. 14a shows double differentiation, whose main disadvantage is the 40 db/decade roll off of the local gain, requiring large peaks at Z for square wave. Values for $Rf_2$, $Rf_4$, $Cf_2$a and b are almost arbitrary and experimenting with them shows just how flexible and uncritical the whole circuit is. No advantages over the simple preferred version were demonstrated.

FIG. 14b shows rather less than double differentiation since the choke required a damping resistor across it in practice. Again, values are almost arbitrary, but no advantages were demonstrated.

FIG. 14c with positive feedback from R3 and R4 advances the intermediate signal to −180°, progressively retarding toward −90° as $Cf_2$ and $Rf_2$ start to predominate at high frequencies. This variation does somewhat extend the bandwidth, but makes very little difference in practice over the preferred version.

The invention can also be used to provide a convenient preamplifier such as may be used to include a volume control. FIG. 17 depicts such a design, with Rv1 acting as the variable volume control. Unlike stand-alone Op. Amps, low DC gain for such an embodiment does not have adverse consequences on stability of the preamplifier. Component values are given in Table 11 below.

TABLE 11

FIG. 17 components

| | |
|---|---|
| $A_1$ = Op 27 | $Rv_1$ = 50KΩ log |
| $A_2$ = NE5534/LF357 | $Rv_2$ = 200KΩ lin |
| | $R_1$ = 220Ω |
| $C_1$ = 22 μF Bi-polar | $R_2$ = 160KΩ |
| $C_2$ = 5 pF R.F. bypass | |
| $Cf_1$ = 330 pF | $Rf_1$ = 1KΩ |
| $Cf_2$ = 220 pF | $Rf_2$ = 100Ω |

TABLE 11-continued

FIG. 17 components

| | |
|---|---|
| $Cf_3$ = 5–60 pF variable | $Rf_3$ = 6.8KΩ |
| CLAMP = FIG. 16e/f (preferably) | $V_1$± = ±15 V |
| | $V_2$± = ±15 V |

In the invention, Bode-Nyquist limitations seem to restrict the amount of differentiated feedback the output amplifier will tolerate, in as much as those which are internally compensated for unity gain will tolerate more than those which are not so compensated. However this limitation is incidental for practical purposes, and imposes no restriction on performance, and merely gives a higher composite $\mu$.

In either case, for the composite loop, 1/β seems to have no real effect on stability, and merely required adjustment to circuit constants. Why this is so has only been investigated for practical purposes and it has been found that Bode-Nyquist limitations do not apply to the composite feedback loop of the invention, in the way they apply to a single Op. Amp, even though the invention is itself effectively a single but composite Op. Amp.

Since the invention is itself a composite operational amplifier, the scope of its application is as wide as the uses to which accurate operational amplifiers are traditionally put. The invention demonstrably defeats many fundamental limitations hitherto considered as applying to operational amplifiers as such.

Further modifications may be made to the invention as would be apparent to a person skilled in the art of amplifier design. For example the intermediate signal could be two fold in nature, one signal and its inverse being fed into the non-inverting and inverting inputs of $A_2$ respectively (in which case the notional non-advanced phase remains the phase of the output voltage signal and its inverse). These modifications may be made without departing from the scope of the invention, the nature of which is to be ascertained from the foregoing description, the claims and the drawings.

What is claimed is:

1. An amplifying circuit high open loop gain for amplifying an input voltage signal to produce an output voltage signal, including an upstream first amplifying stage connected in cascade with a downstream second amplifying stage within an outer loop, said outer loop providing substantially linear amplification over an operating frequency range suitable for audio or instrumentation applications, wherein said second amplifying stage has connected thereto or associated therewith feedback means for providing that when said input voltage signal comprises a sinusoidal input voltage signal within an upper audible frequency range, an intermediate voltage signal measured at an intermediate point of the forward path of the amplifying circuit between the first and second amplifying stages is substantially phase advanced with respect to a notional non-advanced phase, the intermediate voltage signal remaining substantially phase advanced with current load.

2. An amplifying circuit as claimed in claim 1 wherein the high open loop gain of the amplifying circuit is greater than the open loop gain typical of operational amplifiers.

3. An amplifying circuit as claimed in claim 1 wherein the second amplifying stage and/or the first amplifying stage has an open loop gain typical of operational amplifiers.

4. An amplifying circuit as claimed in claim 1 wherein the second amplifying stage and/or the first amplifying stage has a transconductance typical of operational amplifiers, whereby the phase shift of the intermediate signal may remain unchanged under current load.

5. An amplifying circuit as claimed in claim 1 wherein the second amplifying stage and/or the first amplifying stage is a complete stand alone operational amplifier.

6. An amplifying circuit as claimed in claim 1 wherein the feedback means connected to the second operational amplifier is such that the phase advance of the intermediate signal is approximately 90 degrees.

7. An amplifying circuit as claimed in claim 1 wherein the phase advance of the intermediate signal is frequency independent over said frequency range.

8. An amplifying circuit as claimed in claim 1 constructed such that the DC open loop gain of the amplifying circuit is substantially the product of the open loop gains of each amplifying stage, substantially maintained across the power bandwidth.

9. An amplifying circuit as claimed in claim 1 wherein the feedback means is arranged to form with the second amplifying stage an integrator such that when a general input voltage signal is provided, the intermediate voltage signal is proportional to the differential of a voltage signal emerging from the second amplifying stage.

10. An amplifying circuit as claimed in claim 9 wherein the feedback means comprises a capacitor connected between the output of the second amplifying stage and an inverting input of the second amplifying stage, together with a resistor connected between an inverting input of the second amplifying stage and ground, and the intermediate signal is fed into the non-inverting input of the second operational amplifier.

11. An amplifying circuit as claimed in claim 9 wherein the feedback means comprises a capacitor connected between the output of the second amplifying stage and the inverting input of the second amplifying stage together with a resistor connected between said inverting input of the second amplifying stage and the intermediate point, the intermediate signal being fed into the inverting input of the second amplifying stage and the non-inverting input of the second amplifying stage being connected to ground.

12. An amplifying circuit as claimed in claim 1 wherein further feedback means is connected to the first amplifying stage.

13. An amplifying circuit as claimed in claim 12 wherein the further feedback means comprises a capacitor connected between an output of the first amplifying stage and the inverting input of the first amplifying stage.

14. An amplifying circuit as claimed in claim 1 wherein the outer loop comprises an outer loop damping means to reduce the closed loop gain of the amplifying circuit at high frequencies, thereby providing or enhancing stability of the amplifier circuit.

15. An amplifying circuit as claimed in claim 14 wherein the outer loop damping means comprises a capacitor in parallel with a resistor within said outer loop.

16. An amplifying circuit as claimed in claim 1 wherein the second amplifying stage is a power amplifying stage for providing large output currents and/or large output voltage swings.

17. A composite operational amplifier having improved stability and distortion, said composite amplifier comprising an upstream first operational amplifier connected in cascade with a downstream second operational amplifier, feedback means connected to the second operational amplifier such that the second operational amplifier acts as an integrator, and further feedback means connected to the first operational amplifier, and comprising a capacitor connected between the output and an input of the first operational amplifier, for providing that, in use, the composite operational amplifier may be placed within an outer loop of specified DC gain, and stabilising damping means connected to or associated with the outer loop in which the operational is placed to provide stable linear amplification.

18. A composite amplifier comprising:

an upstream first operational amplifier connected in cascade with a downstream second operational amplifier;

feedback means connected to or associated with the second operational amplifier;

further feedback means connected to or associated with the first operational amplifier;

an outer loop with resistive feedback to define a substantially linear amplification suitable for audio or instrumentation applications; and outer loop damping means connected to or associated with the outer loop to reduce the gain of the composite amplifier at high frequencies;

said feedback means and further feedback means providing the composite amplifier with open loop gain substantially greater than the open loop gain of either operational amplifier and said outer loop damping means being adjusted so as to stabilise the composite amplifier.

19. An amplifier as claimed in claim 18 wherein said outer loop damping means comprises a capacitor connected in parallel with a resistor in said outer loop.

20. An amplifier as claimed in claim 18 wherein said first and second operational amplifiers are arranged such that the forward path of the amplifier passes through the non-inverting inputs of both operational amplifiers.

21. An amplifier as claimed in claim 20 wherein said feedback means comprises a capacitor between the output of the second operational amplifier and the inverting input thereof together with a resistor connected between said inverting input and ground, the non-inverting input of the second operational amplifier being connected to the output of the first operational amplifier.

22. An amplifier as claimed in claim 20 wherein said further feedback means comprises a discursion clamped capacitor connected between the output of the first operational amplifier and a point of the outer loop adjacent the inverting input of the first operational amplifier, together with a resistor connected between the inverting input of the first operational amplifier and ground, an input signal for the amplifier being connected to the non-inverting input of the first operational amplifier.

23. An amplifier as claimed in claim 18 wherein said first and second operational amplifiers are arranged such that the forward path of the amplifier passes through the inverting inputs of both operational amplifiers.

24. An amplifier as claimed in claim 18 wherein said feedback means has substantially no DC component.

25. An amplifier as claimed in claim 18 wherein said further feedback means has substantially no DC component.

26. An amplifier as claimed in claim 18 wherein said feedback means is differentiating, causing the second operational amplifier to act as an integrator.

27. An amplifier as claimed in claim 18 wherein said feedback means constitutes differentiating feedback modified by positive DC feedback.

28. An amplifier as claimed in claim 18 wherein said feedback means is double differentiating.

* * * * *